(12) United States Patent
Izumi

(10) Patent No.: US 9,498,944 B2
(45) Date of Patent: Nov. 22, 2016

(54) PRESSURING MODULE, PRESSURING APPARATUS, SUBSTRATE BONDING APPARATUS, SUBSTRATE BONDING METHOD, AND BONDED SUBSTRATE

(71) Applicant: NIKON CORPORATION, Tokyo (JP)

(72) Inventor: Shigeto Izumi, Yokohama (JP)

(*) Notice: Subject to any disclaimer, the term of this patent is extended or adjusted under 35 U.S.C. 154(b) by 0 days.

(21) Appl. No.: 14/299,511

(22) Filed: Jun. 9, 2014

(65) Prior Publication Data

US 2014/0262045 A1    Sep. 18, 2014

Related U.S. Application Data

(63) Continuation of application No. 13/431,764, filed on Mar. 27, 2012, now abandoned, which is a continuation of application No. PCT/JP2010/005823, filed on Sep. 28, 2010.

(30) Foreign Application Priority Data

Sep. 28, 2009 (JP) ................. 2009-223344
Oct. 7, 2009 (JP) ................. 2009-233882
Oct. 7, 2009 (JP) ................. 2009-233885

(51) Int. Cl.
*B32B 37/10* (2006.01)
*B32B 41/00* (2006.01)
(Continued)

(52) U.S. Cl.
CPC ............... *B32B 41/00* (2013.01); *B32B 37/10* (2013.01); *H01L 21/67005* (2013.01); *H01L 21/67092* (2013.01); *H01L 21/67253* (2013.01); *H01L 21/68785* (2013.01); *Y10T 428/24595* (2015.01)

(58) Field of Classification Search
CPC ......... B32B 3/30; B32B 37/10; B32B 41/00; H01L 21/67005; H01L 21/67092; H01L 21/67253; H01L 21/68785
USPC ................ 156/351, 358, 366, 367, 378, 379
See application file for complete search history.

(56) References Cited

U.S. PATENT DOCUMENTS

2004/0031338 A1    2/2004 Chen et al.
2008/0047651 A1 *  2/2008 Park ............................... 156/60

FOREIGN PATENT DOCUMENTS

JP          04-339595          11/1992
JP          04339595 A    *    11/1992
JP          10-180499           7/1998
(Continued)

OTHER PUBLICATIONS

Machine translation of JP 2004-268113, Sep. 30, 2004, Fujitsu Ltd.*
(Continued)

*Primary Examiner* — George Koch
(74) *Attorney, Agent, or Firm* — Finnegan, Henderson, Farabow, Garrett & Dunner LLP

(57) ABSTRACT

A pressuring module includes a stage having a mounting surface on which an object to be pressured is mounted; a plurality of pressure detecting sections that detect a pressure applied on the mounting surface; and a pressure varying section that varies a pressure distribution across a plane of the mounting surface, by differing a pressing force against the object to be pressured between a periphery and a central portion of the mounting surface in a plane direction of the mounting surface based on the pressure detected by the plurality of pressure detecting sections.

19 Claims, 20 Drawing Sheets

(51) Int. Cl.
*H01L 21/67* (2006.01)
*H01L 21/687* (2006.01)

(56) References Cited

FOREIGN PATENT DOCUMENTS

| | | | |
|---|---|---|---|
| JP | 2004-268113 | | 9/2004 |
| JP | 2004-268113 A | | 9/2004 |
| JP | 2004268113 A | * | 9/2004 |
| JP | 2007-067273 | | 3/2007 |
| JP | 2007067273 A | * | 3/2007 |
| JP | 2008-262971 A | | 10/2008 |
| JP | 2008262971 | | 10/2008 |
| JP | 2009-049066 | | 3/2009 |
| JP | 2009-049066 A | | 3/2009 |
| JP | 2009049066 | | 3/2009 |
| JP | 2009-200303 | | 9/2009 |
| WO | WO2005/093826 A1 | | 10/2005 |
| WO | WO2007/150012 A2 | | 12/2007 |
| WO | WO 2008/001626 A1 | | 1/2008 |

OTHER PUBLICATIONS

Machine translation of JP 2009-049066, Mar. 5, 2009, Niko Corp.*
English-language International Search Report from the Japanese Patent Office in International Application No. PCT/JP2010/005823 mailed Dec. 28, 2010 (4 pages).
English-language International Preliminary Report on Patentability in International Application No. PCT/JP2010/005823 dated Apr. 11, 2012 (1 page).
English-language Written Opinion of the International Searching Authority in International Application No. PCT/JP2010/005823 mailed Dec. 28, 2010 (6 pages).
Office Action mailed May 9, 2014 by State Intellectual Property Office of P. R. China (40 pages).
Extended European search report, pursuant to Rule 62 EPO, the supplementary European search report and European search opinion dated (mailed) Jul. 2, 2014.
Office Action of the Japanese Patent Office related to Patent Application No. JP 2011-532916, dated Jul. 15, 2014.
European Patent Office Communication enclosing the European search report dated Apr. 29, 2015 for Application No. 15150438.8, 6 pages.
Office Action of the Japanese Patent Office related to Patent Application No. 2014-185113, dated Aug. 11, 2015.
Office Action issued in the Japanese Application No. 2014-185113; mailed May 17, 2016; Japanese and English-language translation (5 pgs.).
Office Action issued in the Korean Application No. 10-2012-7010098; mailed Aug. 31, 2016; with English-language translation (10 pgs.).

* cited by examiner

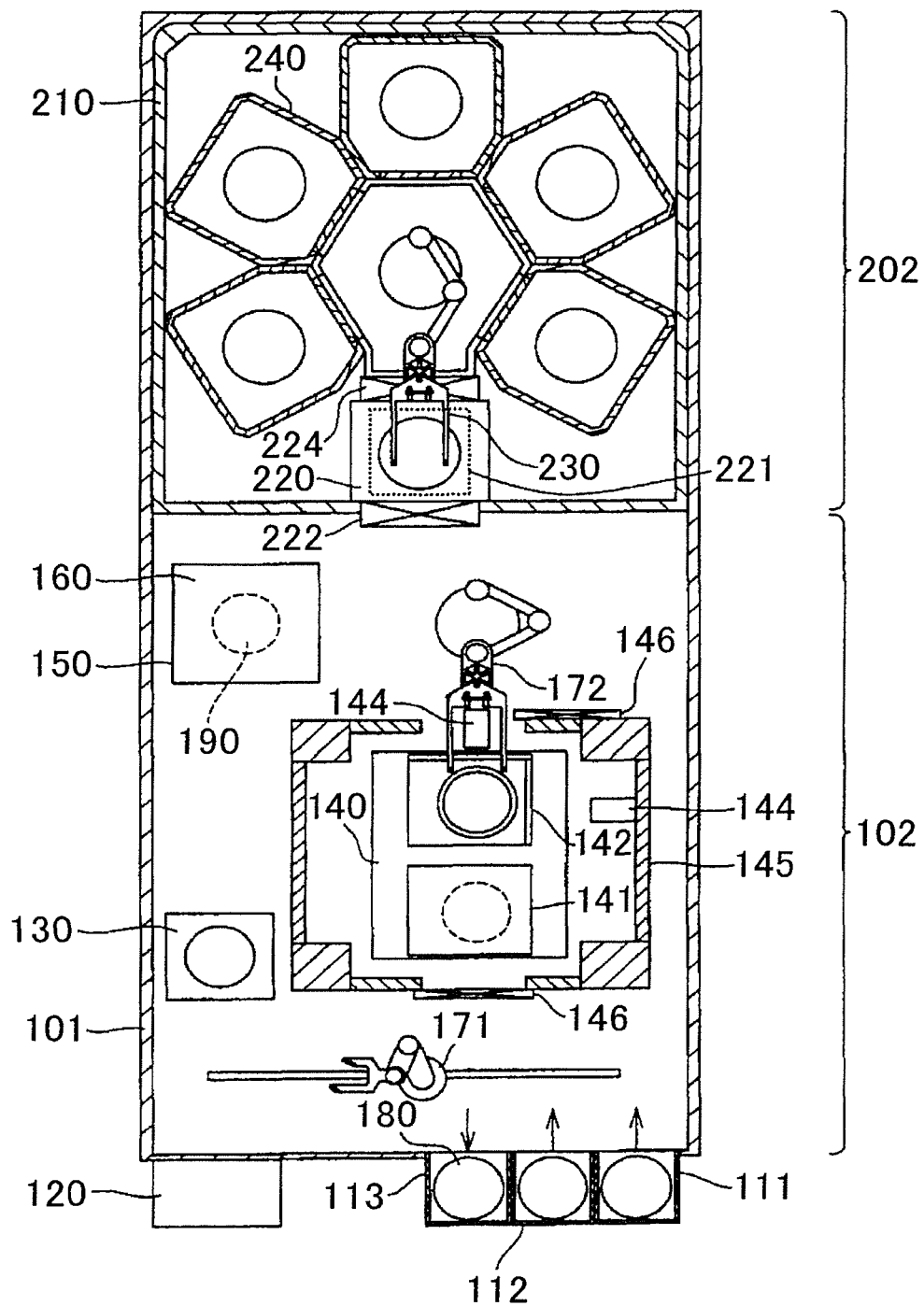
F I G . 1

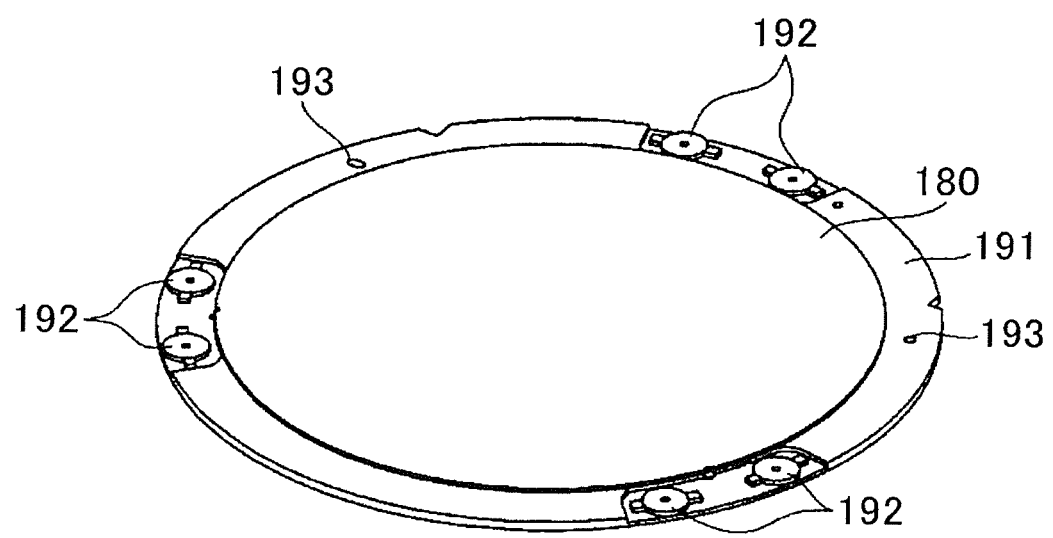
F I G . 2

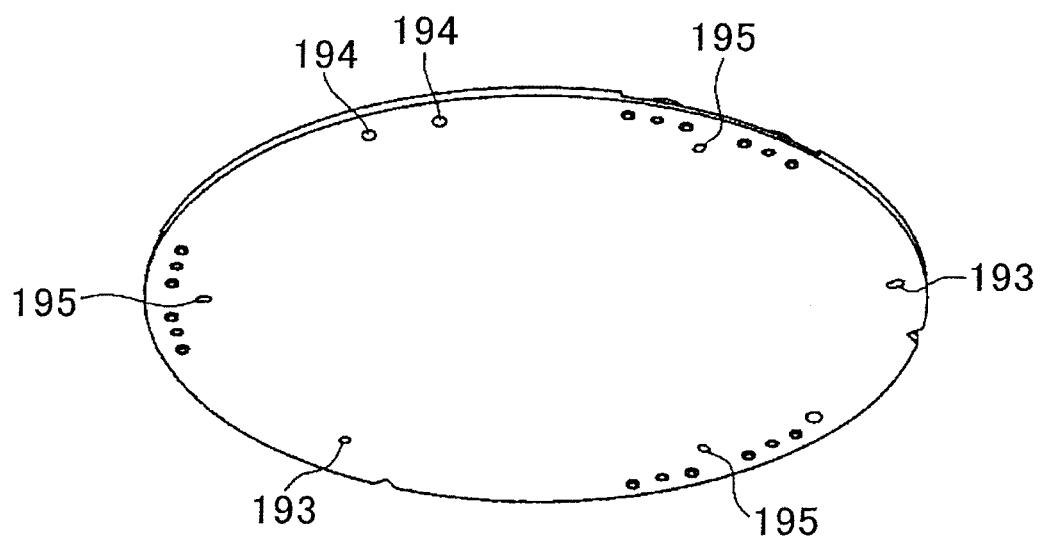
F I G . 3

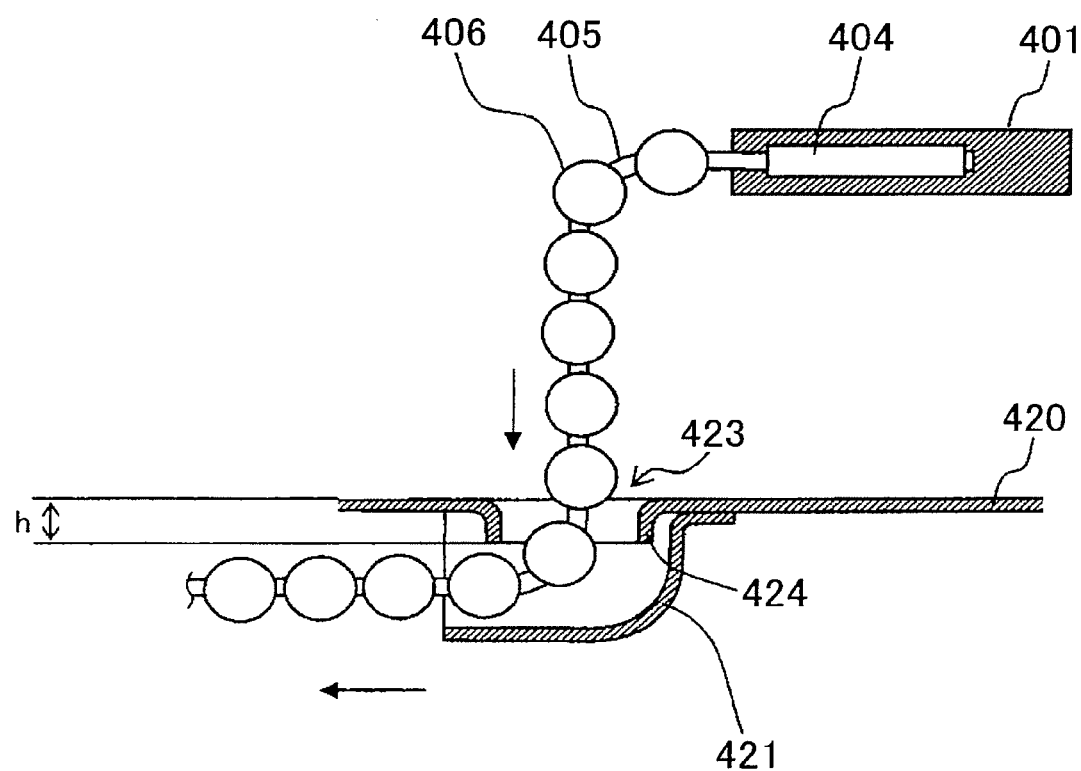
F I G . 9

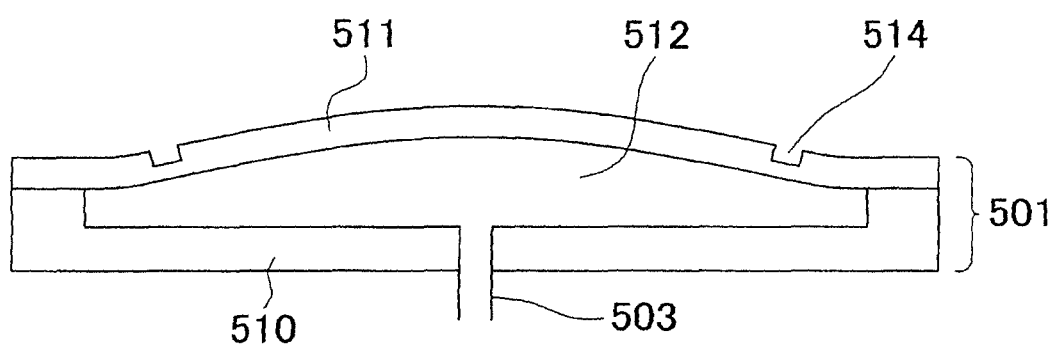
F I G . 14

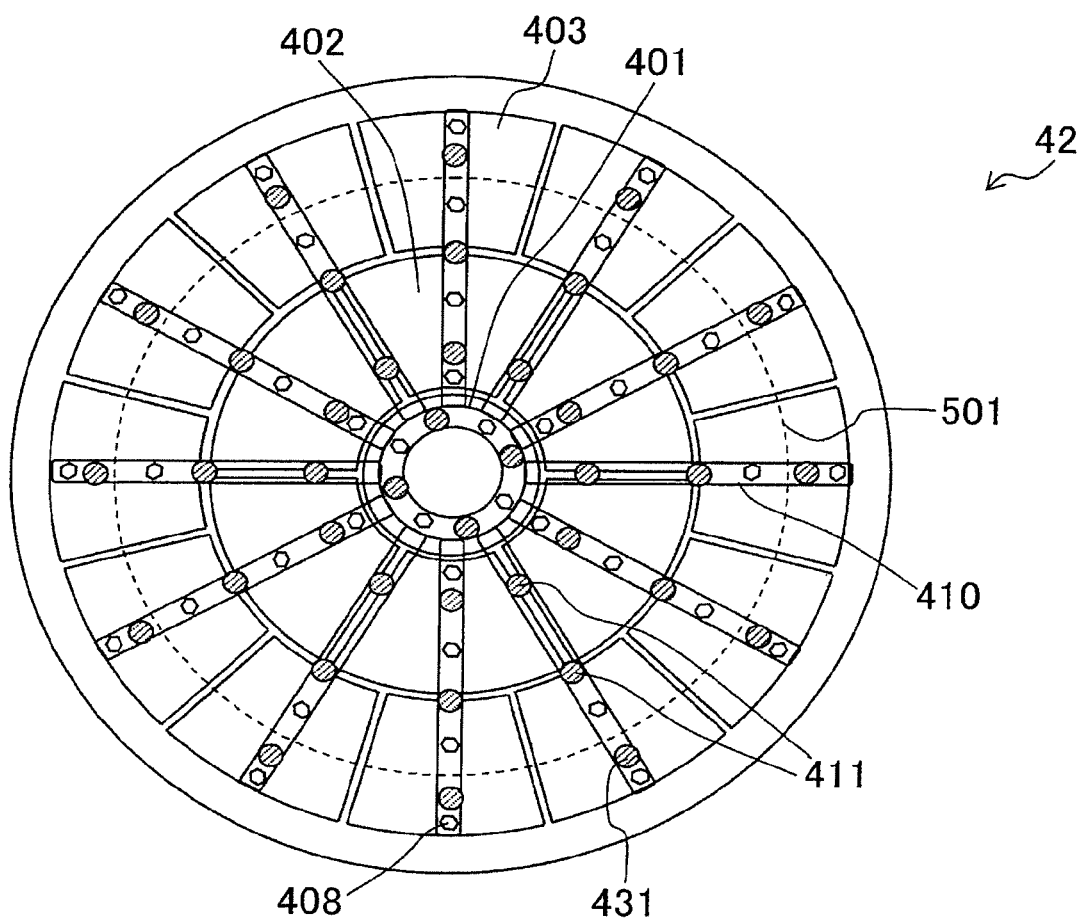
F I G . 17

PRESSURING MODULE, PRESSURING APPARATUS, SUBSTRATE BONDING APPARATUS, SUBSTRATE BONDING METHOD, AND BONDED SUBSTRATE

This is a continuation of application Ser. No. 13/431,764, filed Mar. 27, 2012 now abandoned, which claims the benefit of priority of Japanese Patent Application No. 2009-223344, filed Sep. 28, 2009; Japanese Patent Application No. 2009-233882, filed Oct. 7, 2009; and Japanese Patent Application No. 2009-233885, filed Oct. 7, 2009. The entire contents of the above referenced applications are incorporated herein by reference.

1. TECHNICAL FIELD

The present invention relates to a pressuring module, a pressuring apparatus, a substrate bonding apparatus, a substrate bonding method, and a bonded substrate.

2. RELATED ART

Japanese Patent Application Publication No. 2009-49066 describes a wafer bonding apparatus that bonds two wafers on which circuitry has been formed by heating and pressuring, thereby manufacturing a third-dimensional laminated semiconductor apparatus. When bonding a wafer larger than a chip, it is required to pursue bonding by creating a condition under which the entire wafer can be in press-contact. The wafer bonding apparatus uses a pressure profile control module to control the pressure.

However, depending on how the pressure profile control module is structured and controlled, a large difference is caused in pressure uniformity across the plane of the wafer in press-contact.

SUMMARY

Therefore, an aspect related to the innovations herein is to provide a pressuring module, a pressuring apparatus, a substrate bonding apparatus, a substrate bonding method, and a bonded substrate, which can solve the above-mentioned problems. This is achieved by combinations of the features of the claims According to a first aspect related to the innovations herein, provided is a pressuring module including a stage having a mounting surface on which an object to be pressured is mounted; a plurality of pressure detecting sections that detect a pressure applied on the mounting surface; and a pressure varying section that varies a pressure distribution across a plane of the mounting surface, by differing a pressing force against the object to be pressured between a periphery and a central portion of the mounting surface in a plane direction of the mounting surface based on the pressure detected by the plurality of pressure detecting sections.

According to a second aspect related to the innovations herein, provided is a pressuring apparatus having the above-explained pressuring modules provided to oppose each other.

According to a third aspect related to the innovations herein, provided is a substrate bonding apparatus including: the above-described pressuring module, and another stage provided to oppose the stage of the pressuring module, where the substrate bonding apparatus bonds a plurality of substrates mounted between the stage of the pressuring module and the another stage.

According to a fourth aspect related to the innovations herein, provided is a substrate bonding method including: mounting a plurality of substrates between mounting surfaces of a pair of opposing stages; detecting a pressure applied on the mounting surfaces using a plurality of pressure detecting sections; and varying a pressure by varying a pressure distribution across a plane of the mounting surfaces, by differing a pressing force against an object to be pressured between a periphery and a central portion of the mounting surfaces in a plane direction of the mounting surfaces based on the pressure detected by the plurality of pressure detecting sections.

According to a fifth aspect related to the innovations herein, provided is a bonded substrate resulting from the stated substrate bonding method.

The summary clause does not necessarily describe all necessary features of the embodiments of the present invention. The present invention may also be a sub-combination of the features described above.

BRIEF DESCRIPTION OF THE DRAWINGS

FIG. 1 is a plan view schematically showing the entire structure of a bonding apparatus.

FIG. 2 is a perspective view showing a substrate holder observed from above.

FIG. 3 is a perspective view showing a substrate holder observed from below.

FIG. 9 is a sectional view of the wiring of an electric heater.

FIG. 14 is a conceptual sectional view of the state in which the hollow pressuring section is swollen.

FIG. 17 is a top view of the lower heat module which reveals the positional relation between the first supporting column 418 and the second supporting column 431.

DESCRIPTION OF EXEMPLARY EMBODIMENTS

Figure 4:
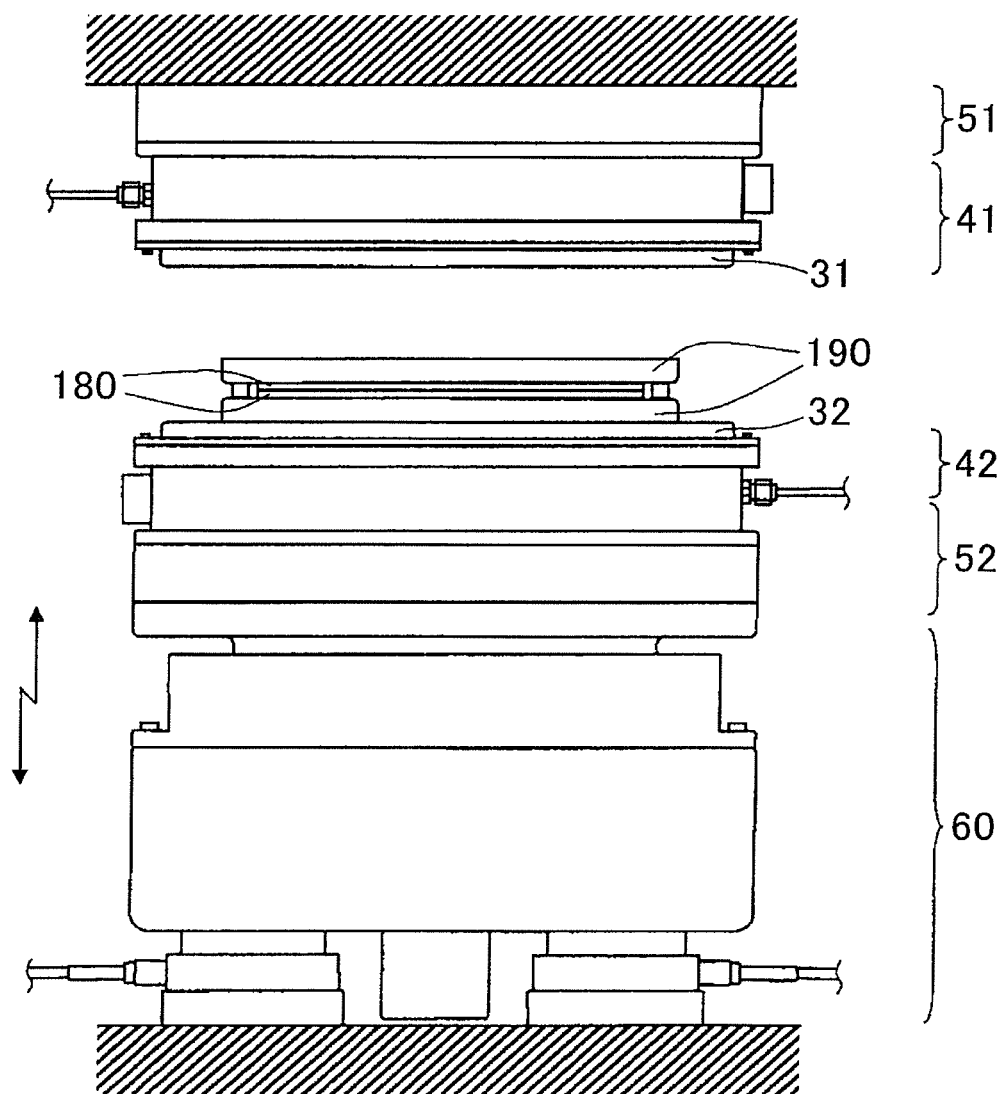
FIG. 4 is a front view schematically showing the entire structure of a pressuring apparatus.

Hereinafter, some embodiments of the present invention will be described. The embodiments do not limit the invention according to the claims, and all the combinations of the features described in the embodiments are not necessarily essential to means provided by aspects of the invention.

FIG. 1 is a plan view schematically showing the entire structure of a bonding apparatus 100 including a pressuring apparatus 240. The bonding apparatus 100 includes an atmosphere environment section 102 and a vacuum environment section 202 created inside a common casing 101.

The atmosphere environment section 102 includes a plurality of substrate cassettes 111, 112, and 113, and a control plate 120. Operation of each element of each apparatus included in the bonding apparatus 100 is realized by control of the entire bonding apparatus 100 as well as the cooperative control or the integrated control performed by the control plate 120 controlling operation and the control operation sections provided for respective elements. The control plate 120 includes an operating section which a user can operate from outside when turning on the power switch of the bonding apparatus 100 or performing various settings thereto. The control plate 120 may also include a connecting section to connect to other installed appliances.

The substrate cassettes 111, 112, and 113 are for accommodating therein a substrate 180 to be bonded or having already been bonded by the bonding apparatus 100. The substrate cassettes 111, 112, and 113 are detachably mounted to the casing 101. Accordingly, the plurality of substrates 180 can be collectively mounted to the bonding apparatus 100. It becomes also possible to collectively collect the substrates 180 finished being bonded by the bonding apparatus 100.

The atmosphere environment section 102 includes a pre-aligner 130, a provisional bonding apparatus 140, a substrate holder rack 150, a substrate removing section 160, and a pair of robot arms 171, 172, which are respectively provided in the casing 101. The temperature management is performed inside the casing 101 to maintain therein substantially the same temperature as in the environment in which the bonding apparatus 100 is installed. This facilitates accurate alignment by stabilizing the accuracy of the provisional bonding apparatus 140.

The provisional bonding apparatus 140 is an apparatus to accurately align two opposing substrates 180 to superpose them, and so its adjustment range is very narrow. Therefore, prior to bringing substrates 180 into the provisional bonding apparatus 140, the pre-aligner 130 is used to roughly grasp the position of the individual substrates 180 so that the substrates 180 can fall within the adjustment range allowed by the provisional bonding apparatus 140. In the actual installment to the provisional bonding apparatus 140, the substrates 180 are handed to the robot arm 172 by adjusting their orientations based on the roughly grasped position by the pre-aligner 130. This process helps accurate alignment in the provisional bonding apparatus 140.

The substrate holder rack 150 waits while accommodating therein a plurality of substrate holders 190. The concrete configuration of the substrate holder 190, designed to hold the substrates 180 by electrostatic suction, is detailed later.

The provisional bonding apparatus 140 includes a fixed stage 141, a movable stage 142, and an interferometer 144. A heat insulating wall 145 and a shutter 146 are provided to surround the provisional bonding apparatus 140. The space surrounded by the heat insulating wall 145 and the shutter 146 is subjected to temperature management by communicating to an air conditioner or the like, to maintain the alignment accuracy of the provisional bonding apparatus 140.

The movable stage 142 of the provisional bonding apparatus 140 conveys the substrate 180 or the substrate holder 190 holding the substrate 180. The fixed stage 141, on the contrary, holds the substrate holder 190 or the substrate 180 in the fixed state.

The substrate removal section 160 removes the substrate 180 bonded by being sandwiched by the substrate holder 190, from the substrate holder 190 taken out from the pressuring apparatus 240 detailed later. The substrate 180, having been taken out from the substrate holder 190, is returned and accommodated in the substrate cassette 113 by the robot arms 172, 171 and the movable stage 142. The substrate holder 190, from which the substrate 180 has been taken out, is returned to the substrate holder rack 150 and waits.

The substrate 180 to be mounted to the bonding apparatus 100 may be a single silicon wafer, a compound semiconductor wafer, or the like, already provided with a plurality of periodic circuitry patterns. The mounted substrate 180 may also be a laminated substrate formed by laminating a plurality of wafers.

Among the robot arms 171, 172, the robot arm 171 located nearer the substrate cassettes 111, 112, and 113 conveys the substrate 180 between the substrate cassettes 111, 112, 113, the pre-aligner 130, and the provisional bonding apparatus 140. The robot arm 171 also has a function of flipping one of the substrates 180 to be bonded. This robot arm 171 can facilitate bonding substrates 180 together by opposing respective surfaces on which circuitry, elements, terminals, or the like are formed.

On the other hand, the robot arm 172 located farther from the substrate cassettes 111, 112, and 113 conveys the substrate 180 and the substrate holder 190 between the provisional bonding apparatus 140, the substrate holder rack 150, the substrate removing section 160, the substrate holder rack 150, and the air lock chamber 220. The robot arm 172 also carries in and out the substrate holder 190 to and from the substrate holder rack 150.

The vacuum environment section 202 includes a heat insulating wall 210, an air lock chamber 220, a robot arm 230, and a plurality of pressuring apparatuses 240. The heat insulating wall 210 surrounds the vacuum environment section 202, to maintain a high temperature within the vacuum environment section 202, as well as to prevent heat radiation from fleeing to outside the vacuum environment section 202. Accordingly, the effect of the heat of the vacuum environment section 202 onto the atmosphere environment section 102 can be restrained.

The robot arm 230 conveys the substrate 180 and the substrate holder 190 between any of the pressuring apparatuses 240 and the air lock chamber 220. The air lock chamber 220 includes shutters 222, 224 that open and close alternately, which are provided respectively for the atmosphere environment section 102 and the vacuum environment section 202.

When the substrate 180 and the substrate holder 190 are transported from the atmosphere environment section 102 to the vacuum environment section 202, the shutter 222 at the atmosphere environment section 102 is first opened, and the robot arm 172 conveys the substrate 180 and the substrate holder 190 to the air lock chamber 220. Next, the shutter 222 at the atmosphere environment section 102 is closed, and the shutter 224 at the vacuum environment section 202 is opened.

The air lock chamber 220 is provided with a heater 221, using which the substrate 180 and the substrate holder 190 to be carried in are pre-heated prior to undergoing pressurized heating by the pressuring apparatus 240. To be more specific, prior to carrying the substrate 180 and the substrate holder 190 into the pressuring apparatus 240, they are heated the to a certain degree in the air lock chamber 220 making best use of the time required for exchanging its atmosphere, thereby improving the throughput of the pressuring apparatus 240. It is desirable to start heating the inside of the air lock chamber 220 prior to carrying the substrate 180 and the substrate holder 190 into the air lock chamber 220. This helps shorten the duration during which the substrate 180 and the substrate holder 190 have to stay in the air lock chamber 220.

Subsequently, the robot arm 230 takes the substrate 180 and the substrate holder 190 out of the air lock chamber 220, and mounts them to one of the pressuring apparatuses 240. Each pressuring apparatus 240 pressures in the heat the substrate 180 carried in the pressuring apparatus 240 by being sandwiched by the substrate holder 190. Accordingly, the substrate 180 is eternally bonded. The concrete processing and configuration are detailed later.

The pressuring apparatus 240 includes a main body to pressure the substrate 180 and the substrate holder 190 and a pressuring chamber in which the main body is installed. The robot arm 230 is provided within the robot arm chamber. In other words, the plurality of pressuring chambers, the robot arm chamber, and the air lock chamber 220, which constitute the vacuum environment section 202, are respectively partitioned, to be able to adjust their atmospheres independently from each other. In addition, as shown in the drawings, the vacuum environment section 202 is designed such that the plurality of pressuring chambers and the air lock chambers 220 align in the circumferential direction with the robot arm chamber at the center.

When carrying out the substrate 180 and the substrate holder 190 from the vacuum environment section 202 to the atmosphere environment section 102, the above-described series of operations are executed in the reverse order. According to the series of operations, the substrate 180 and the substrate holder 190 can be carried in and out to and from the vacuum environment section 202, without leaking any internal atmosphere of the vacuum environment section 202 towards the atmosphere environment section 102.

Note that one of the plurality of pressuring apparatuses 240 can be replaced by a cooling apparatus. In this case, a cooling chamber in which the cooling apparatus is to be installed is also provided in the robot arm chamber's vicinity. The substrate 180 and the substrate holder 190, after heated by the pressuring apparatus 240, are transported into the cooling apparatus, and the cooling apparatus cools them to be a certain temperature. It is desirable that the cooling apparatus cools the cooling chamber in advance, prior to receiving the substrate 180 and the substrate holder 190 having been heated.

The following briefly explains the flow in which two substrates 180 are superposed onto each other and integrated. After the bonding apparatus 100 has started operating, the robot arm 171 carries the substrates 180 one by one to the pre-aligner 130, thereby pre-aligning the substrates 180. During this process, the substrates 180 whose bonding surface is downward are prioritized in pre-aligning. In parallel with the pre-aligning process, the robot arm 172 removes the substrate holder 190 accommodated with its surface to hold the substrate 180 oriented downward is removed from the substrate holder rack 150, and carries it to the fixed stage 141 whose mounting surface is oriented downward. The fixed stage 141 fixes, by vacuum suction, the transported substrate holder 190. Note that the fixed stage 141 is positioned above the movable stage 142.

Thereafter, the robot arm 171 takes out the pre-aligned substrate 180 from the pre-aligner, orients its bonding surface downward using the reverse mechanism during the transportation, and provisionally places it over the plurality of push-up pins protruding from the movable stage 142. The substrate 180 provisionally positioned over the push-up pins will be raised towards the fixed stage 141 by the push-up pins, to abut against the mounting surface of the substrate holder 190 already fixed to the fixed stage 141. The substrate holder 190 receives power from the fixed stage 141, to fix the substrate 180 by electrostatic suction.

Next, the substrates 180 whose bonding surface is oriented upward are pre-aligned. In parallel with this processing, the robot arm 172 takes out the substrate holder 190 whose surface to hold the substrate 180 is oriented upward is removed from the substrate holder rack 150, and carries it to the movable stage 142 whose mounting surface is oriented upward. The movable stage 142 fixes, by vacuum suction, the transported substrate holder 190. Note that push-up pins are retreated from the stage surface of the movable stage 142 when the substrate holder 190 whose surface to hold the substrate 180 is oriented upward is transported to the movable stage 142.

Thereafter, the robot arm 171 takes out the pre-aligned substrate 180 from the pre-aligner, and mounts it on the mounting surface of the substrate holder 190 already fixed to the movable stage 142. The substrate holder 190 receives power from the movable stage 142, to fix the substrate 180 by electrostatic suction. In this way, pairs of a substrate holder 190 and a substrate 180 are fixed to their stages so that the bonding surfaces of the two substrates oppose each other.

When the substrates 180 are fixed with their bonding surfaces opposed to each other, the movable stage 142 is moved with precision by monitoring its position using the interferometer 144, and the bonding surface of the mounted substrate 180 is aligned to the bonding surface of the substrate 180 held by the fixed stage 141. After completion of this alignment, the movable stage 142 is moved towards the fixed stage 141, and the substrates are provisionally bonded by contacting their bonding surfaces. The provisional bonding is pursued by integration by operating the suction mechanisms provided for the two opposing substrate holders 190.

The two substrates 180 and the two substrate holders 190 integrated by the provisional bonding are transported to the air lock chamber 220 by means of the robot arm 172. After transported to the air lock chamber 220, the substrate 180 and the substrate holder 190 are mounted to the pressuring apparatus 240 by means of the robot arm 230.

The two substrates 180 are heated and pressured by the pressuring apparatus 240, thereby being bonded together and eternally integrated. Thereafter, the substrate 180 and the substrate holder 190 are taken out from the vacuum environment section 202, to be carried in the substrate removing section 160, to be separated from each other therein.

The bonded substrates 180 are transported to the substrate cassette 113 to be stored therein. The movable stage 142 is also used in transportation from the robot arm 172 to the robot arm 171 during this process. The substrate holder 190 is returned to the substrate holder rack 150 by means of the robot arm 172.

The following explains the substrate holder 190. FIG. 2 is a perspective view showing a substrate holder 190 observed from above. In this drawing, the substrate 180 is held on the upper surface of the substrate holder 190. FIG. 3 is a perspective view showing the substrate holder 190 observed from below.

The substrate holder 190 includes a holder main body 191, suction members 192, and voltage applying terminals 194, and forms a round plate whose diameter is size larger than the substrate 180 on the whole. The holder main body 191 is integrally formed by a highly rigid material such as ceramics or metal. The suction members 192 are formed by a ferromagnetic material, and are provided on the circumferential area of the surface to hold the substrate 180, which is outside of the held substrate 180. In this drawing, a total of six suction members 192 are provided, each pair of them provided at 120 degrees relative to each other. The voltage applying terminal 194 is embedded on the rear surface relative to the surface to hold the substrate 180.

The holding surface of the holder main body 191 has a high level of planarity. In addition, the holder main body 191 has a plurality of aligning holes 193 formed from the front to rear surfaces of the holder main body 191, outside the region at which the held substrate 180 is adhered by electrostatic suction. The holder main body 191 also has a plurality of insertion holes 195 formed from the front to rear surfaces of the holder main body 191, inside the region at which the held substrate 180 is adhered by electrostatic suction. A push-up pin is inserted to each insertion hole 195, to detach the substrate 180 from the substrate holder 190.

The alignment holes 193 are fitted to the alignment pins of the fixed stage 141 or the like, and are used for aligning the substrate holder 190. The suction members 192 are embedded in the concave region of the holder main body 191, with their upper surface positioned at substantially the same plane as the holding surface. The voltage applying terminals 194 are embedded in the rear surface of the holder main body 191. By supplying a voltage through the voltage applying terminals 194, a potential difference is caused between the substrate holder 190 and the substrate 180, thereby attaching the substrate 180 to the substrate holder 190 by electrostatic suction. Such members as the fixed stage 141 are provided with voltage supply terminals respectively, so as to sustain the electrostatic suction between the substrate 180 and the substrate holder 190.

There is a slight difference in configuration between the substrate holder 190 mounted on the movable stage 142 and the substrate holder 190 mounted on the fixed stage 141. Specifically, instead of providing the suction members 192, a plurality of magnets are provided to correspond in position to the suction members 192. By means of coupling of the suction members 192 to the magnets, the two substrates 180 are sandwiched, to integrate the two substrate holders 190. Thus integrated two substrates 180 and two substrate holders 190 are occasionally referred to as "a substrate-holder pair."

The following elaborates the structure of the pressuring apparatus 240. FIG. 4 is a front view schematically showing the entire configuration of the pressuring apparatus 240. The pressuring apparatus 240 is installed in the pressuring chamber adjusted under the vacuum environment. The pressuring apparatus 240 is configured by an upper top plate 31, an upper heat module 41, and an upper pressure control module 51 which are installed at the ceiling, as well as a lower top plate 32, a lower heat module 42, a lower pressure control module 52, and an elevation module 60 which are installed on the floor. The upper top plate 31, the upper heat module 41, and the upper pressure control module 51 form an upper pressuring module, and the lower top plate 32, the lower heat module 42, the lower pressure control module 52 form a lower pressuring module. Note that in the present embodiment, each of the upper pressuring module and the lower pressuring module can also function as a heating module, because the upper heat module 41 and the lower heat module 42 heat the upper top plate 31 and the lower top plate 32.

A substrate-holder pair in which the two substrate holders 190 are integrated while sandwiching the two substrates 180 is carried onto the lower top plate 32 by means of the robot arm 230. When the elevation module 60 is lifted up, the substrate-holder pair is brought into contact with the upper top plate 31, sandwiched between the upper pressuring module and the lower pressuring module, and pressured and heated.

The upper pressuring module and the opposing lower pressuring module have the same structure as each other. The structure of them is briefly explained as follows, taking an example of the lower pressuring module.

Figure 5:
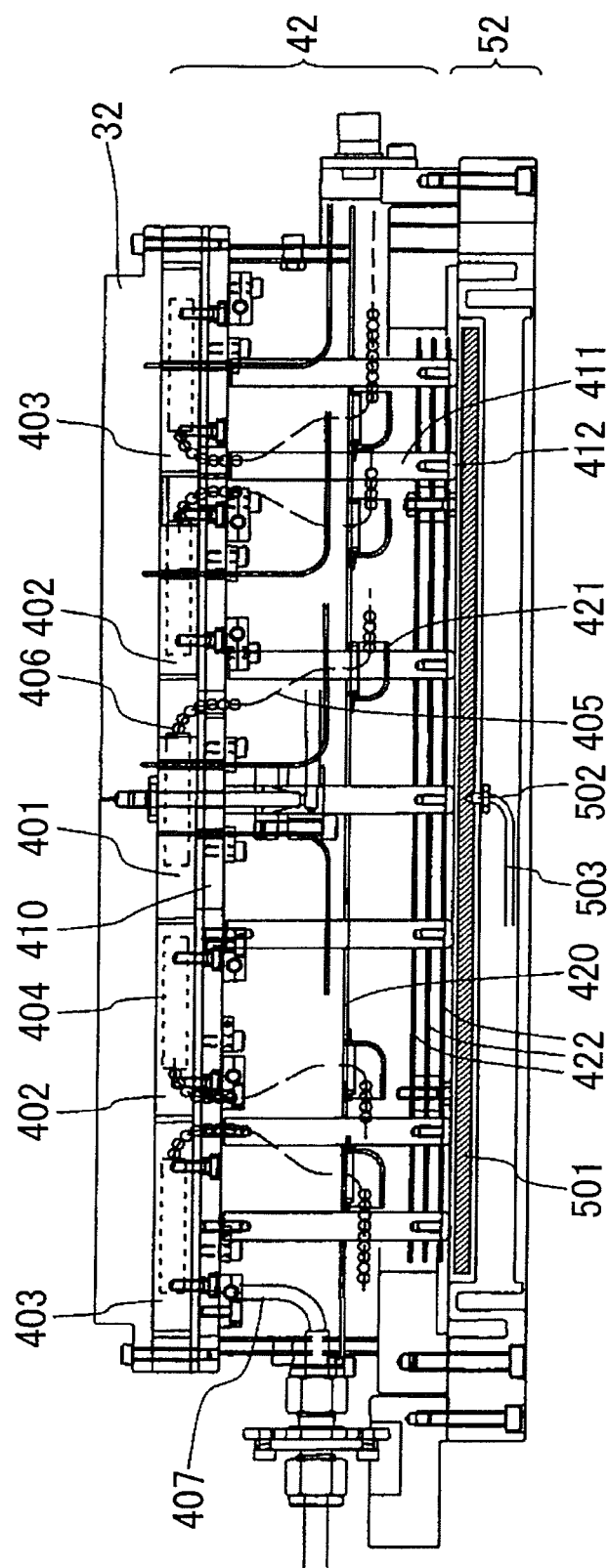
FIG. 5 is a diagrammatic sectional view of the structure of a lower pressuring module.

FIG. 5 is a diagrammatic sectional view of the configuration of a lower pressuring module. Note that the figure is a simplified diagram of the main structure, with some part thereof omitted.

The lower top plate 32, which functions as a stage on which the substrate-holder pair is mounted, is a round plate made of silicon carbide, and is screwed to the lower heat module 42 at the periphery. The lower heat module 42 includes, inside its cylindrical shape, a plurality of heater plates 401, 402, 403 in contact with the surface of the lower top plate 32 opposite to the surface on which the substrate-holder pair is mounted. The heater plates 401, 402, 403 are heating sections, which are formed by copper for example, and electric heaters 404 are embedded in them respectively. A conductive wire 405 is used to supply power to the electric heater 404, and a bead 406 made of ceramics for example is used to cover the conductive wire 405 for protection from high temperatures. A plurality of such beads 406 are combined to let the conductive wire 405 penetrate and introduce the conductive wire 405 from the heating space to the non-heating space.

During heating control, the heater plates 401, 402, 403 are heated by the electric heater 404 and convey the heat to the lower top plate 32. During cooling control after completion of the heating, the heater plates 401, 402, 403 are cooled by a cooling tube 407 functioning as a cooler. The heater plates 401, 402, 403 are supported and fixed by the frame 410 formed radially from the central axis passing the center of the lower top plate 32.

The frame 410 is supported by being linked to one end of each of the plurality of supporting columns 411 in the axial direction. The other end of each supporting column 411 is linked to a load cell 412. Each load cell 412 is provided in contact with the exterior of the hollow pressuring section 501, being one of the main elements of the lower pressure control module 52, at the surface opposite to the surface linked to the supporting column 411. The load cell 412 is a pressure detecting section, and straddles the hollow pressuring section 501 and the supporting column 411, to detect the pressure applied from the hollow pressuring section 501 towards the supporting column 411.

The internal space of the lower heat module 42 is divided between an upper heating space and a lower non-heating space by a heat shielding plate 420 provided parallel to the mounting surface of the substrate-holder pair of the lower top plate 32. The heat shielding plate 420 is a partition having a function of preventing, as much as possible, conveyance of the heat in the heating space heated by the heater plates 401, 402, 403 to the non-heating space in which the hollow pressuring section 501, the load cell 412, or the like are provided which are susceptible to high temperatures. The heat shielding plate 420 has a penetration hole provided for passing the supporting column 411 therethrough. In other words, the supporting column 411 straddles the heating space and the non-heating space. The heat shielding plate 420 also has a penetration hole provided for passing the conductive wire 405 therethrough. Moreover, a cap 421 is provided around the penetration hole, to conduct the conductive wire 405 into a direction different from the direction in which it is extracted from the penetration hole.

A plurality of thermal reflectors 422 distant from each other are provided in parallel to the heat shielding plate 420, between the heat shielding plate 420 and the hollow pressuring section 501. Just as the heat shielding plate 420, the thermal reflectors 422 also have penetration holes for passing the supporting column 411 therethrough. These thermal reflectors 422 are made of metal plate(s) such as aluminum. A multi-layer film is provided on the surface facing the heating space of at least one of the thermal reflectors, to reflect the wavelength of the radiation near the targeted heating temperature of the lower top plate 32. The targeted heating temperature of the lower top plate 32 is 450 to 500 degrees centigrade when the substrate 180 to be bonded is a wafer. The thermal reflector 422 may be configured to be replaceable depending on the targeted heating temperature. This helps alleviate the heat conveyance from the heater plates 401, 402, 403 to the hollow pressuring section 501. Not limited to the direction parallel to the heat shielding plate 420, the thermal reflector(s) 422 may also be provided in parallel to the axial direction of the supporting column 411. This helps alleviate leak of heat from the lower heat module 42 to outside.

The hollow pressuring section 501 is a pressure control section in a bag-like form made of a rubber sheet or the like, and is filled with a fluid. Some examples of the fluid are air, water, and oil. For example, hydrofluoroether having excellent environment characteristics may be used. The amount of fluid used to fill the inside is adjusted by controlling the valve 502 provided for the hollow pressuring section 501 and the supply tube 503. Specifically, the other end of the supply tube 503 is connected to a pump not illustrated in the drawing. By controlling the pump together with the valve 502, the amount of fluid inside the hollow pressuring section 501 can be increased or decreased. The hollow pressuring section 501 expands or contracts due to the amount of the internal fluid. Specifically, by adjusting the amount of fluid from or into the inside using the valve 502, taking into consideration the pressure imposed on the lower pressure control module 52 from the elevation module 60, the surface to be in contact with the plurality of load cells 412 can be controlled to be flat, have a form with a convex periphery, or a form with a convex center.

Not limited to a bag-like form made of an elastic material such as a rubber sheet, the hollow pressuring section 501 may have a form like a box with the planes to be in contact with the plurality of load cells 412 being deformable plate(s) as well as the planes facing the elevation module 60 and the circumference being rigid plate(s). In such an embodiment too, as long as the inside space is maintained just like an airtight bag, the internal pressure is adjustable by controlling the fluid to be in and out to and from the outside, thereby enabling to control the pressure with respect to surface in contact with the load cells 412.

Figure 6:
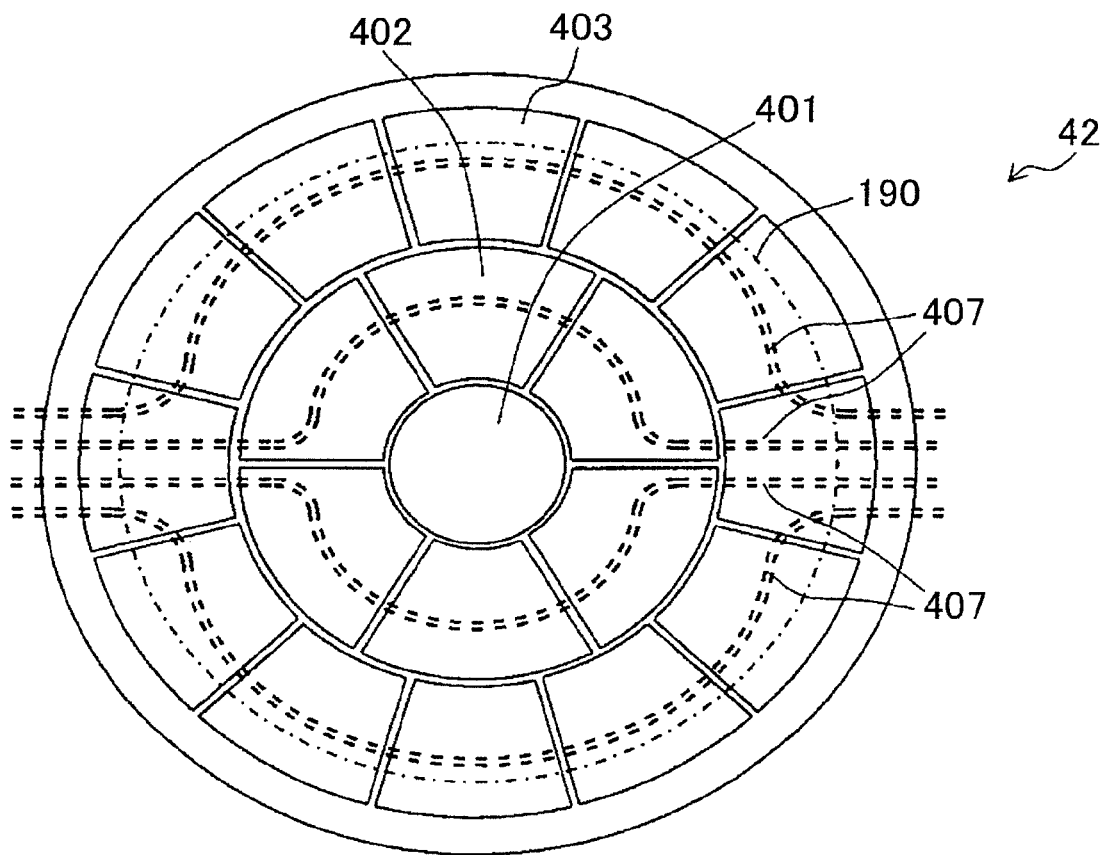
FIG. 6 is a top view of a lower heat module which reveals the shape and alignment of the heater plate.

The following explains the shape and arrangement of the heater plates 401, 402, 403. FIG. 6 is a top view of the lower heat module 42 which reveals the shape and alignment of the heater plates 401, 402, 403.

As shown in this drawing, by setting, as a center, the central axis passing the center of the lower top plate 32, one round heater plate 401 is provided in the center, six heater plates 402 in a fan-like shape are provided to surround it, and 12 heater plates 403 in a fan-like shape are further provided to surround them. The fan-like shape of the heater plates 402, 403 have an arc of a circle concentric with the heat plate 401 at the center.

The plane area covered by the heater plates 401, 402, 403 is larger than the area corresponding to the mounting surface of the substrate holder 190 mounted on the lower top plate 32. This enables heating of the rear surface of the substrate holder 190 evenly. In addition, the heater plates 401, 402, and 403 are parallel to each other with a distance therebetween. Accordingly, even when the heater plates 401, 402, 403 are heated to be expanded by the electric heater 404 embedded therein, they are prevented from being in contact to each other. The interval between the heater plates 401, 402, 403 is pre-set taking into consideration the targeted heating temperature or the like. For example when the heater plates 401, 402, 403 are made of copper, the diameter of the lower top plate 32 is about 330 mm, and the targeted heating temperature is 450 degrees centigrade, the interval for the heater plates 401, 402, 403 is set to be about 1 mm.

The heating surface of each heater plate 401, 402, 403 has the same area as each other. Therefore, the diameter, the central angle or the like of the round shape or the fan-like shape are designed to yield the same area. In the example of the drawing, the diameter direction is divided in three stages. However, the number of stages in the diameter direction or the number of rounds or fans in one stage can be arbitrarily set. It is further preferable to equalize the thicknesses of the heater plates 401, 402, and 403, to yield the same heat capacity therebetween.

The cooler tube 407 functioning as a cooler is provided to cool one or more of the heater plates 401, 402, 403. For example, as the drawing shows, a pipe as the cooler tube 407 extends to be in contact with either of the heater plates 402, 403, and an external pump is controlled to circulate the cooling medium therein. The material of the pipe is desirably the same as the material of the heater plates 401, 402, 403. If not exactly the same, if at least having the same linear expansion coefficient as the heater plates, the material is usable as a pipe because there will be no thermal slide due to temperature change at the contact surface.

Figure 7:
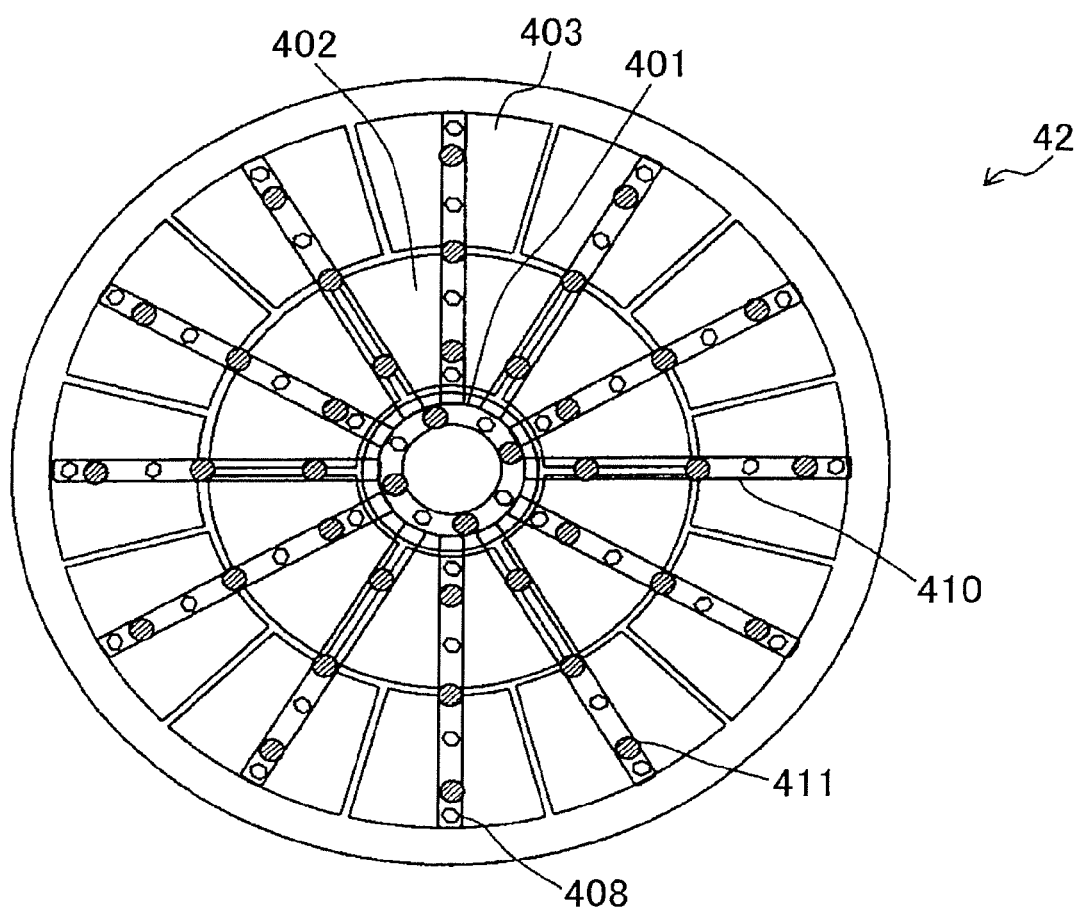
FIG. 7 is a top view of a lower heat module which reveals the positional relation among the heater plates, the frame, and the supporting columns.

FIG. 7 is a top view of a lower heat module 42 which reveals the positional relation among the heater plates 401, 402, 403, the frame 410, and the supporting columns 411. The frame 410 has such a shape that a plurality of arms elongate radially from the annular portion at the center. The heater plate 401 is fixed to the annular portion using a screw 408, and the heater plates 402 and 403 are fixed to the arms using screws 408. It is desirable that the screws 408 be arranged on the central line of the heater plates 401, 402, 403, and either to be rotational symmetrical or bilaterally symmetrical.

The pressure from the hollow pressuring section 501 is conveyed to the heater plates 401, 402, 403 via the plurality of supporting column 411 and the frame 410. Then, the heater plates 401, 402, 403 pressure the lower top plate 32 and heat it. If the hollow pressuring section 501 is considered as an actuator generating a pressing force in the axial direction of the supporting column 411, the pressing force is conveyed in such an order starting from the supporting column 411, the heater plate 402, and to the lower top plate 32, focusing on the supporting column 411 pressuring the heater plate 402. In terms of the relation of the pressing surfaces thereof, the pressing surface of the supporting column 411 against to the heater plate 402 is smaller than the pressing surface of the heater plate 402 against the lower top plate 32. In other words, the pressure is conveyed by spreading in the direction to convey, i.e., a localized pressure is gradually distributed. In this way, the pressure generated by the hollow pressing section 501 is conveyed towards the lower top plate 32, thereby generating a constant pressing force onto the lower top plate 32, or generating a pressure distribution that is intentionally smoothed out on the lower top plate 32 so as to pressurize the entire substrate 180 evenly. Although having a frame 410 between the heater plates 401, 402, 403 and the supporting column 411 in the present embodiment, the localized pressure is also conducted by being gradually distributed in the present embodiment in a vicinity of each supporting column 411.

Although explaining the configuration of pressing the plurality of supporting columns 411 by a single hollow pressuring section 501 that expands or contracts by adjusting the amount of the internal fluid, the present embodiment can also be applied to the configuration of using an actuator that pressurizes each of the supporting columns 411 independently. In other words, even if the pressure generated by the actuator is limited to locally, the pressure can be gradually distributed, to pressurize the lower top plate 32 with a wide area.

Figure 8:
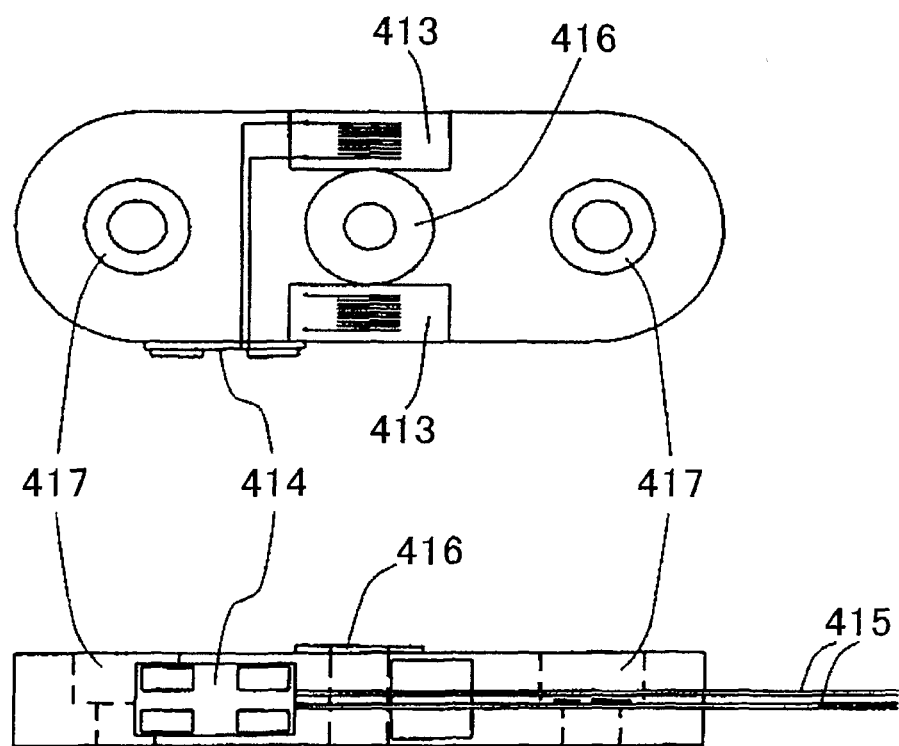
FIG. 8 shows both of a top view and a front view of a load cell.

The following explains the load cells 412 in contact with the exterior of the hollow pressuring section 501, and interposed between the hollow pressing section 501 and the supporting columns 411. FIG. 8 shows both of a top view and a front view of a load cell 412. Distortion gauges 413, being a piezoelectric element, are attached to two portions on the upper surface of the load cell 412. Likewise, distortion gauges 413 are attached to two portions on the lower surface. The output lines from the distortion gauges attached to the four portions are combined into the terminal section 414 at the side surface, to be connected to the outside via the conductive wire 415.

In a vicinity of the center of the upper surface, a screw hole 416 to link the supporting column 411 is provided. Moreover, two screw holes 417 are also provided to be symmetrical to the screw hole 416. The load cell 412 is fixed to the hollow pressuring section 501 via this screw hole 417.

The pressure applied to each supporting column 411 can be detected by monitoring the output from the plurality of load cells 412 provided in the above manner. Adjustment of the pressure of the hollow pressuring section 501 or the lifting and lowering of the elevation module 60 can be pursued depending on the detected pressure. It is further possible to control to stop the pressurizing, when detecting an abnormal pressure exceeding the expected range.

The piezoelectric element can detect an applied pressure because it causes a potential difference according to the level of supplied pressure, and can be physically deformed if applied power. Therefore, when the pressure distribution is found in a certain area while detecting the pressure of the supporting column 411, power can be supplied to the distortion gauge 413 of the load cell 412 in the area or an area other than the area, to increase the pressure to the supporting column 411. By operating the load cell 412 as an auxiliary actuator in this way, more accurate pressure control can be realized. This is particularly preferable to evenly pressurize the substrate-holder pair mounted on the lower top plate 32. In some cases, the hollow pressuring section 501 may be omitted when using the load cell 412 as an actuator. The position of the load cells 412 is not limited to as explained. Alternatively, the load cells 412 may be provided on the elevation module 60 to enable adjustment of the pressure applied to the lower pressure control module.

FIG. 9 is a sectional view of the wiring of an electric heater 404. Although the heater plate 401 is taken as an example in this embodiment, the heater plates 402, 403 may also be configured in the same way.

As shown in this drawing, a conductive wire 405 is extracted from the electric heater 404 embedded in the heater plate 401. In an environment that would not become too hot, the conductive wire is normally protected with a vinyl film. In the present embodiment, however, the heater plate 401 is heated up to 450 to 500 degrees centigrade, a vinyl film would not be an option. In addition, since the heating space and the non-heating space around the conductive wire are vacuum atmospheres, such a material as resin that generates a gas in the vacuum atmosphere cannot be used either. With these in view, a bead 406 made of an insulation material that would not emit a gas even under a vacuum atmospheric environment, as well as having a melting point higher than the temperature of the heating space is used as a protective material of the conductive wire 405. One preferable material is ceramics. A plurality of the beads 406 protecting the conductive wire 405 are linked to each other across the heating space and the non-heating space to allow insertion of the conductive wire 405 therethrough, so that the conductive wire 405 can be bent.

Even though the heat insulating plate 420 separates between the heating space and the non-heating space, the heat insulating plate 420 is provided with a penetration hole 423 in which to insert the conductive wire 405. A flange 424 is provided at the periphery of the penetration hole 423. The flange 424 is an elevation formed by bending the heat insulating plate 420 in the insertion direction of the conductive wire 405. The penetration section is constituted by the penetration hole 423 and the flange 424.

The beads 406 are linked to each other with an interval therebetween so that the conductive wire 405 be bendable. In other words, the beads 406 respectively have a movable amount in which the beads 406 can move along the conductive wire 405. If this movable amount exceeds the height "h" of the penetrating section, the conductive wire 405 may come in contact with the penetrating section directly. Therefore, the movable amount is set to be smaller than the height "h" of the penetrating section.

Figure 10:
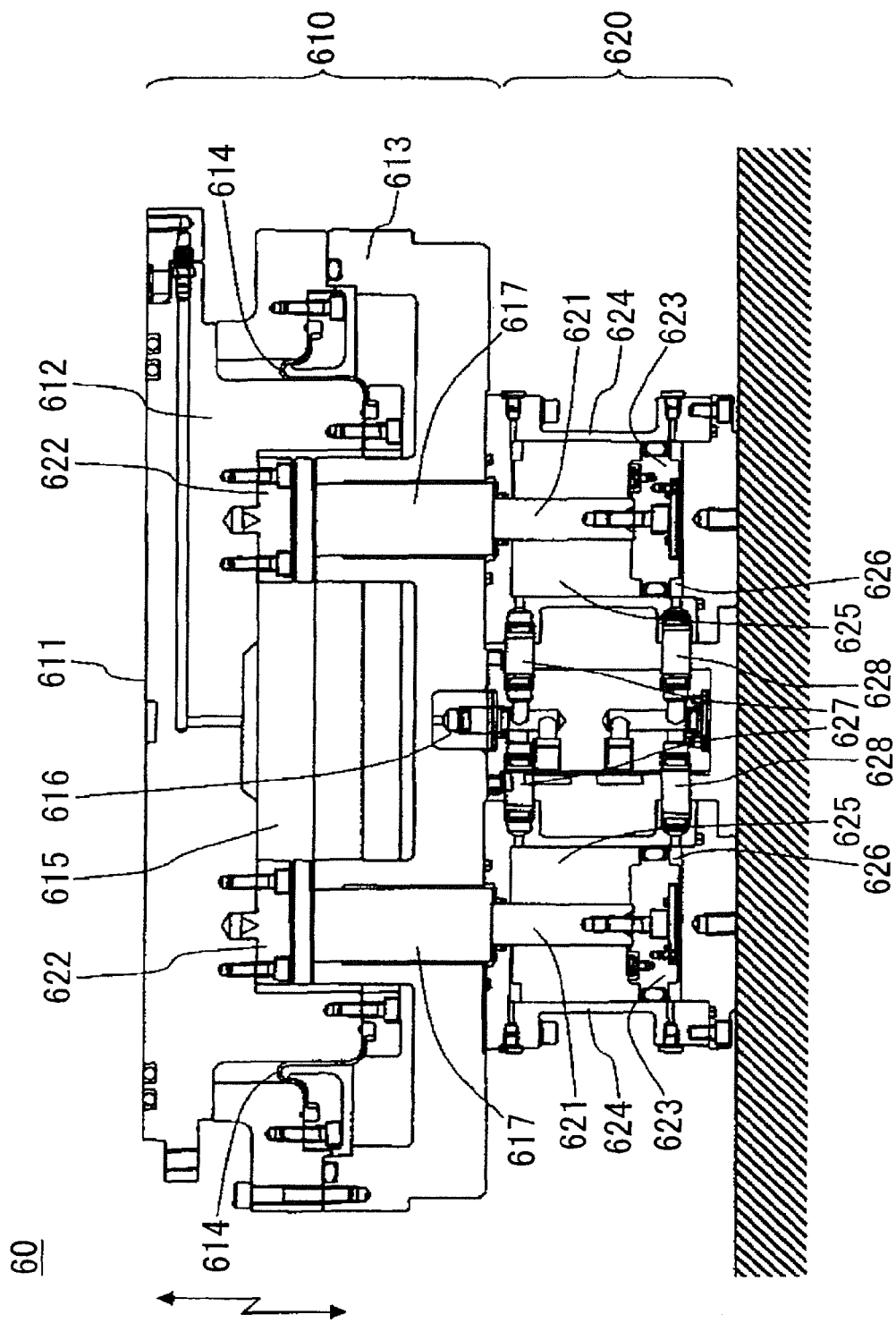
FIG. 10 is a diagrammatic sectional view of the structure of an elevation module.

The following explains the structure of the elevation module 60. FIG. 10 is a diagrammatic sectional view of the configuration of the elevation module 60. Note that the figure is a simplified diagram of the main structure, with some part thereof omitted.

The elevation module 60 is a two-stage structure composed of an upper part and a lower part, which are specifically the main EV section 610 near the lower pressure control module 52 and the sub EV section 620 near the floor. The main EV section 610 is fastened to the lower pressure control module 52 at the stage 611. From the perspective of the whole elevation module 60, this stage 611 is raised or lowered with respect to the floor, to raise or lower the lower pressure control module 52, and further to pressure the substrate-holder pair.

The main EV section 610 is constituted by a single cylinder piston mechanism having a large diameter, and the sub EV section 620 is constituted by three cylinder piston mechanisms each having a small diameter, positioned at 120 degree intervals when observed from above. Here, it should be noted that the main EV section 610 and the sub EV section 620 interact with each other to raise or lower the stage 611, and are not separate bodies simply stacked. The following explains each of these structures.

The main EV section 610 includes a main piston 612 having the stage 611 as its upper surface, a main cylinder 613 externally fitted onto the main piston, and a bellows 614 that is connected to the main cylinder 613 and follows the movement of raising and lowering of the main piston 612. A main room 615 which is a space created between the main cylinder 613 and the main piston 612 is maintained air tight even when the main cylinder 613 is raised or lowered. A main valve 616 is connected to the main room 615, to allow a fluid to flow in and out to and from outside. The main room 615 is filled with a fluid. By the main valve 616 controlling the flow-in and flow-out of the fluid, the amount of fluid in the main room 615 can be changed. The main piston 612 can be raised or lowered by changing the amount of fluid within the main room 615.

As already mentioned, the sub EV section 620 has three cylinder piston mechanisms in the present embodiment. Each cylinder piston mechanism includes a sub piston 621 and a sub cylinder 624 externally fitted onto the sub piston 621. The sub piston 621 is inserted into the piston guide 617 provided for the main cylinder 613 from outside the main cylinder 613, to reach the inside of the main room 615. In addition, a fixing section 622 to fix to the main piston 612 is provided at the end of the sub piston 621 positioned inside the main room 615. The fixing section 622 fastens the sub piston 621 to the main piston 612.

At the end opposite to the end provided with the fixing section 622, the sub piston 621 includes a piston disc 623 externally fitting onto the sub cylinder 624. The space in the sub cylinder 624 is divided by the piston disc 623 into an upper subroom 625 nearer the main cylinder 613 and a lower subroom 626 nearer the floor.

Both of the upper subroom 625 and the lower subroom 626 are maintained airtight. An upper sub valve 627 is connected to the upper subroom 625 using which a fluid comes in and out from outside. To the lower subroom 626, a lower sub valve 628 is connected using which a fluid comes in and out to and from outside. The upper subroom 625 and the lower subroom 626 are filled with a fluid. Moreover, since the total volume of the upper subroom 625 and the lower subroom 626 is always constant, the volume ratio between the upper subroom 625 and the lower subroom 626 can be changed by conducting cooperative control on the upper sub valve 627 and the lower sub valve 628.

When the volume of the upper subroom 625 is increased, the volume of the lower subroom 626 decreases to lower the sub piston 621. Since the sub piston 621 is connected to the main piston 612, the main piston 612 is also lowered. During this process, the main valve 616 is also subjected to cooperative control, to release to outside a fluid in an amount corresponding to the decrease in volume of the main room 615 caused in response to the lowering of the main piston 612.

Figure 11:
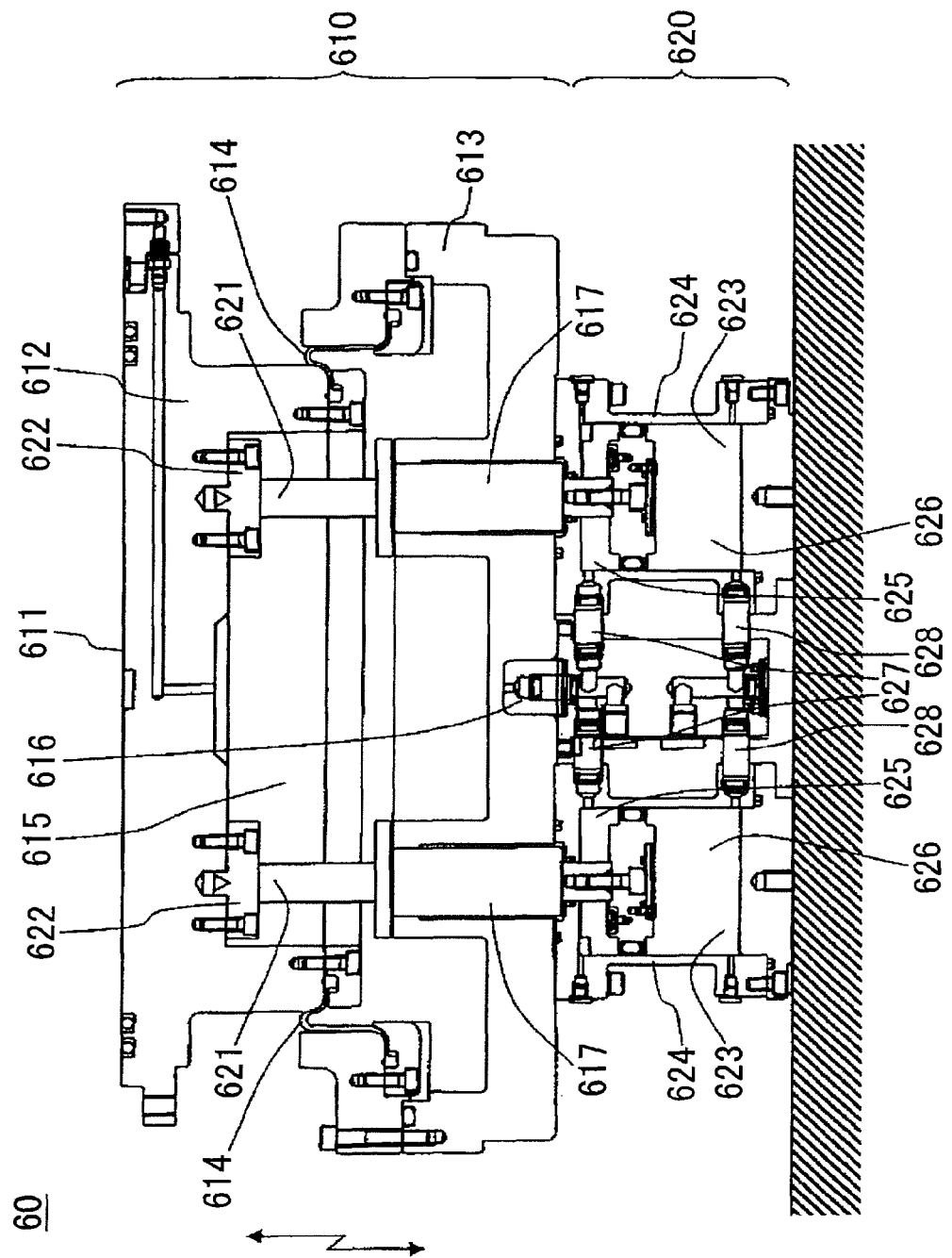
FIG. 11 is a sectional view of the main piston lifted by increasing the volume of the lower subroom.

Conversely, if the volume of the lower subroom 626 is increased, the volume of the upper subroom 625 decreases to raise the sub piston 621. This also raises the main piston 612. During this process, the main valve 616 is also subjected to cooperative control, to flow, into the main room 615, a fluid in an amount corresponding to the increase in volume of the main room 615 caused in response to the elevation of the main piston 612. FIG. 11 is a sectional view of the main piston 612 lifted by increasing the volume of the lower subroom 626.

Note that the sub piston 621 also follows the movement of rising of the main piston 612 when the main piston 612 is raised by adjusting the amount of fluid within the main room 615 using the main valve 616. Therefore in this case, it is possible to allow the change in volume of the upper subroom 625 and the lower subroom 626 occurring in response to the movement of the sub piston 621 following the movement of the main piston 612, by cooperative control on the upper sub valve 627 and the lower sub valve 628.

The fluid used to fill the main room 615, the upper subroom 625, and the lower subroom 626 is air, water, oil, etc. For example, hydrofluoroether having excellent environment characteristics may be used.

By configuring the elevation module 60 in two stages of the main EV section 610 and the sub EV section 620, a variety in control is made possible depending on how to move the stage 611. Specifically, when it is desirable to move it faster than a predetermined speed, the fluid in the sub EV section 620 is controlled, from which a larger displacement is obtained with a small volume of input and output fluid. When it is desired to apply a predetermined pressure or more, the fluid in the main EV section 610 is controlled, which experiences a smaller displacement even with a larger amount of input and output fluid. Control can also be directed to the fluid in the main EV section 610 when the stage 611 is to move slower than a predetermined speed.

According to the above-described embodiment of the pressuring apparatus 240, the upper pressuring module having the same structure as the explained pressuring module is provided, and the elevation module 60 is used to bring into contact, to the upper pressuring module, the substrate-holder pair mounted to the lower pressuring module, thereby performing pressuring and heating. However, not limited to such an embodiment of installing an upper pressuring module on the ceiling, a plane disc may alternatively be installed on the ceiling, to simply press it from below, and can be still expected to yield a certain level of pressure consistency.

Figure 12:
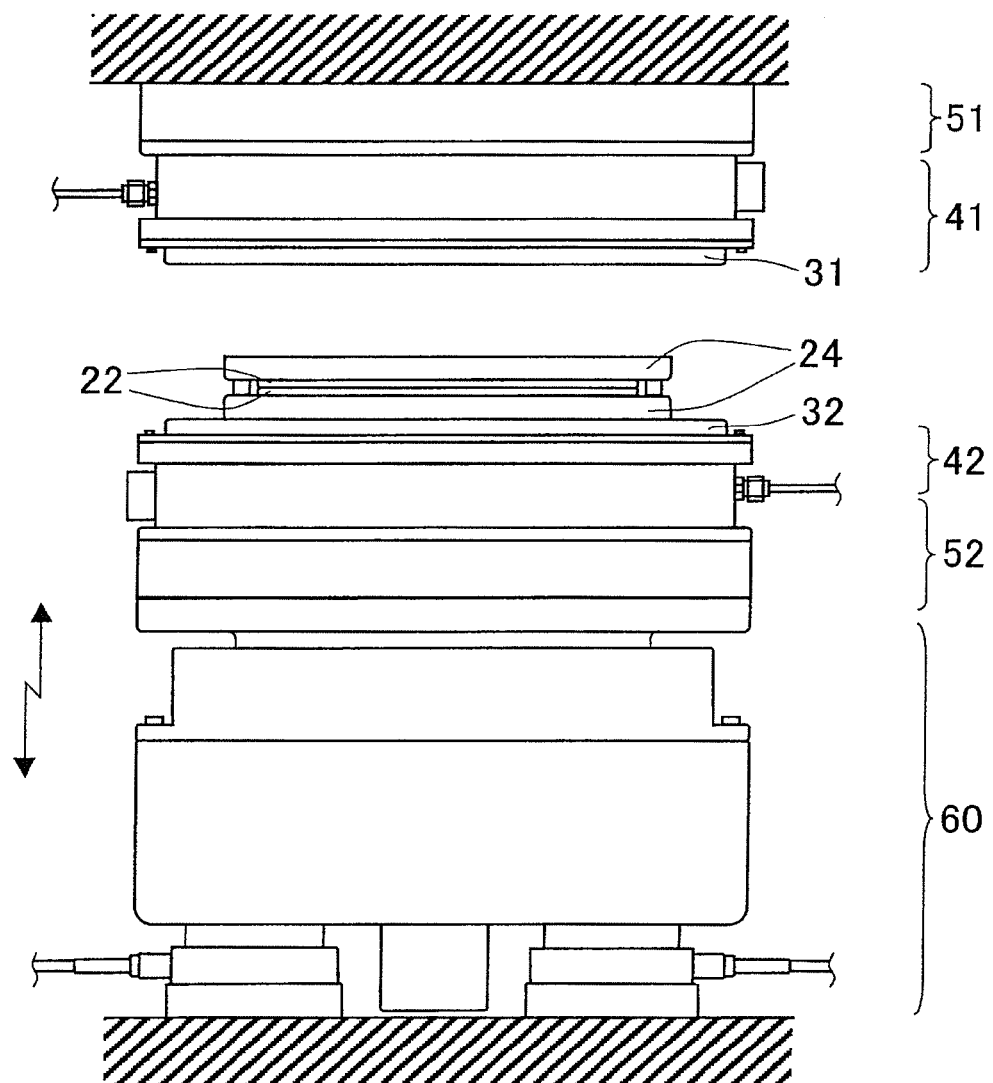
FIG. 12 is a front view schematically showing another example of the pressuring apparatus 840.

FIG. 12 is a front view schematically showing another pressuring apparatus 840. In the drawings on and after FIG. 12, the same members as in FIG. 1 through FIG. 11 are assigned the same reference numerals. The pressuring apparatus 840 is configured by the upper top plate 31, the upper heat module 41, and the upper pressure control module 51 which are installed at the ceiling, and the lower top plate 32, the lower heat module 42, the lower pressure control module 52, and the elevation module 60 which are installed at the floor. The pressuring apparatus 840 is installed within the vacuum chamber in which a certain level of vacuum and cleanliness is maintained for the purpose of preventing the oxidation and contamination of the substrate 22 during the substrate bonding process.

The upper top plate 31, the upper heat module 41, and the upper pressure control module 51 form an upper pressuring module. The lower top plate 32, the lower heat module 42, and the lower pressure control module 52 form a lower pressuring module. Note that in the present embodiment, each of the upper pressuring module and the lower pressuring module can also function as a heating module, because the upper heat module 41 and the lower heat module 42 heat the upper top plate 31 and the lower top plate 32.

An aligner, independent from the pressuring apparatus 840, is used to align and superpose the two substrates 22 to be bonded, so that the electrodes to be bonded together are in contact with each other. These two substrates 22 are retained by being provisionally bonded together to prevent misalignment. Hereinafter, the substrates 22 and the substrate holders 24 in this state are referred to as "a substrate-holder pair."

The substrate-holder pair is carried into the pressuring apparatus 840 by a robot arm and is mounted to the lower top plate 32 (FIG. 12). When the elevation module 60 is lifted up, the substrate-holder pair is brought into contact with the upper top plate 31, sandwiched between the upper pressuring module and the lower pressuring module, and is subjected to substrate bonding processing by being pressured and heated. The upper pressuring module and the opposing lower pressuring module have the same structure. The structure of them is briefly explained as follows, taking an example of the lower pressuring module.

Figure 13:
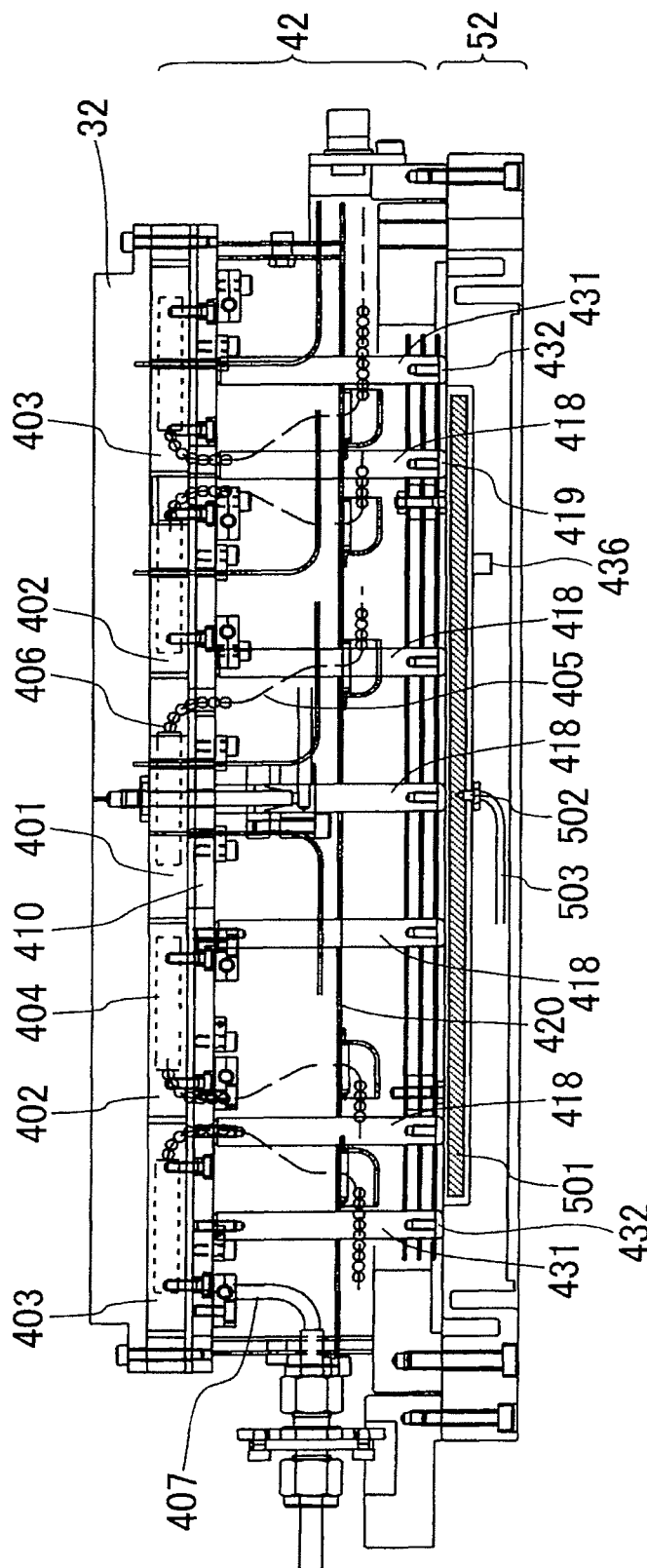
FIG. 13 is a diagrammatic sectional view of the structure of the lower pressuring module.

FIG. 13 is a diagrammatic sectional view of the configuration of the lower pressuring module. The lower top plate 32, which functions as a stage on which the substrate-holder pair is mounted, is a round plate made of silicon carbide, and is screwed to the lower heat module 42 at the periphery.

The lower heat module 42 includes, inside its cylindrical body, a plurality of heater plates 401, 402, 403 in contact with the surface of the lower top plate 32 opposite to the surface on which the substrate-holder pair is mounted. The heater plates 401, 402, 403 heat the lower top plate 32. The heater plates 401, 402, 403 are formed by a material having a favorable heat conductivity (e.g., copper), and electric heaters 404 are embedded in them respectively. A conductive wire 405 is used to supply power to the electric heater 404, and a bead 406 made of ceramics for example is used to cover the conductive wire 405 for protection from high temperatures.

During heating control, the heater plates 401, 402, 403 are heated by the electric heater 404 and convey the heat to the lower top plate 32. During cooling control after completion of the heating, the heater plates 401, 402, 403 are cooled by a cooling tube 407 functioning as a cooler. The heater plates 401, 402, 403 are supported and fixed by the frame 410 formed radially from the central axis passing the center of the lower top plate 32.

The frame 410 is supported by being linked to one end of each of the plurality of first supporting columns 418 and second supporting columns 431. The other end of each of the plurality of first supporting columns 418 and second supporting columns 431 is connected to either a first pressure detecting section 419 or a second pressure detecting section 432. Each first pressure detecting section 419 is provided to contact with the exterior of the hollow pressuring section 501 of the lower pressure control module 52, at the surface opposite to the surface linked to the first supporting columns 418. The first pressure detecting sections 419 detect pressure applied from the hollow pressuring section 501 towards the first supporting columns 418. The first pressure detecting section 419 may be a load cell.

Each second pressure detecting section 432 is provided to contact with the lower plate, being the main body of the lower pressure control module 52, at the surface opposite to the surface linked to the second supporting columns 431. The second pressure detecting section 432 detects pressure applied from the main body of the lower pressure control module 52 towards the second supporting columns 431. The second pressure detecting section 432 may be a load cell.

The internal space of the lower heat module 42 is divided between an upper heating space and a lower non-heating space by a heat shielding plate 420 provided parallel to the mounting surface of the substrate-holder pair of the lower top plate 32. The heat shielding plate 420 is a partition having a function of preventing, as much as possible, conveyance of the heat in the heating space heated by the heater plates 401, 402, 403 to the non-heating space in which the hollow pressuring section 501, the first pressure detecting section 419, or the like are provided which are susceptible to high temperatures. The heat shielding plate 420 has a penetration hole provided for passing the first supporting column 418 and the second supporting columns 431 therethrough. In other words, the first supporting columns 418 and the second supporting columns 431 straddle the heating space and the non-heating space. The heat shielding plate 420 also has a penetration hole provided for passing the conductive wire 405 therethrough.

The hollow pressuring section 501 is a hollow pressure controller and is filled with a fluid. Some examples of the fluid are air, water, and oil. The hollow pressuring section 501 adjusts the amount of filled fluid, by controlling the valve 502 provided between the hollow pressuring section 501 and the supply tube 503. The hollow pressuring section 501 can control the pressure of the internal fluid by adjusting the amount of filled fluid.

The pressure of the fluid in the hollow pressuring section 501 is detected and monitored using a pressure sensor 436. It is further possible to control to stop the pressurizing, when detecting an abnormal pressure exceeding the expected range.

The hollow pressuring section 501 may have a bag-like form made of a rubber sheet or the like. The hollow pressuring section 501 expands or contracts due to the amount of the internal fluid, thereby enabling to control the pressure against the surface in contact with the plurality of first pressuring detecting section 419. The hollow pressuring section 501 may have a form like a box with the planes to be in contact with the plurality of first pressure detecting sections 419 being deformable plate(s) as well as the planes facing the elevation module 60 and the periphery being rigid plate(s). In such an embodiment too, as long as the internal pressure is maintained just like an airtight bag, the internal pressure is adjustable by controlling the fluid to be in and out to and from the outside, thereby enabling to control the pressure with respect to surface in contact with the plurality of first pressure detecting sections 419. Specifically, by adjusting the amount of fluid from or into the inside using the valve 502, taking into consideration the pressure imposed on the lower pressure control module 52 from the elevation module 60, the surface to be in contact with the plurality of first pressure detecting sections 419 can be controlled to be flat, have a form with a convex periphery, or a form with a convex center.

Figure 15:
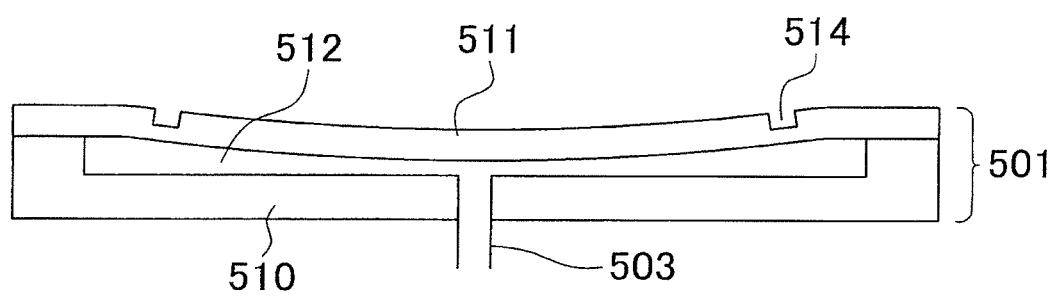
FIG. 15 is a diagrammatic sectional view of the state in which the hollow pressuring section is deflated.

FIG. 14 and FIG. 15 show a conceptual sectional view of the shape of the hollow pressuring section 501. The hollow pressuring section 501 includes a lower plate 510, an upper plate 511, and a hollow chamber 512 created therebetween. As already described, the hollow chamber 512 is filled with a fluid supplied from the supply tube 503. The upper plate 511 is provided with grooves 514 on the outer periphery as a concentric circle with its center being the center of the upper plate 511. When the upper plate 511 is deformed, the grooves 514 can alleviate the stress concentration at the periphery of the upper plate 511.

FIG. 14 conceptually shows how the upper plate 511 is deformed when the pressure of the fluid introduced into the hollow chamber 512 is raised. When the pressure of the internal fluid in the hollow pressuring section 501 is high, the upper plate 511 expands, thereby deforming towards the exterior of the hollow chamber 512. The deformation of the upper plate 511 is the largest at the central portion and gradually decreases towards the periphery.

FIG. 15 conceptually shows how the upper plate 511 is deformed when the pressure of the fluid in the hollow chamber 512 is lowered. When the pressure of the internal fluid in the hollow pressing section 501 is low, the upper plate 511 is deflated, thereby deforming towards the inside of the hollow chamber 512. In this case too, the deformation of the upper plate 511 is the largest at the central portion and gradually decreases towards the periphery, with the deformation direction reversed to the case of FIG. 14.

Figure 16:
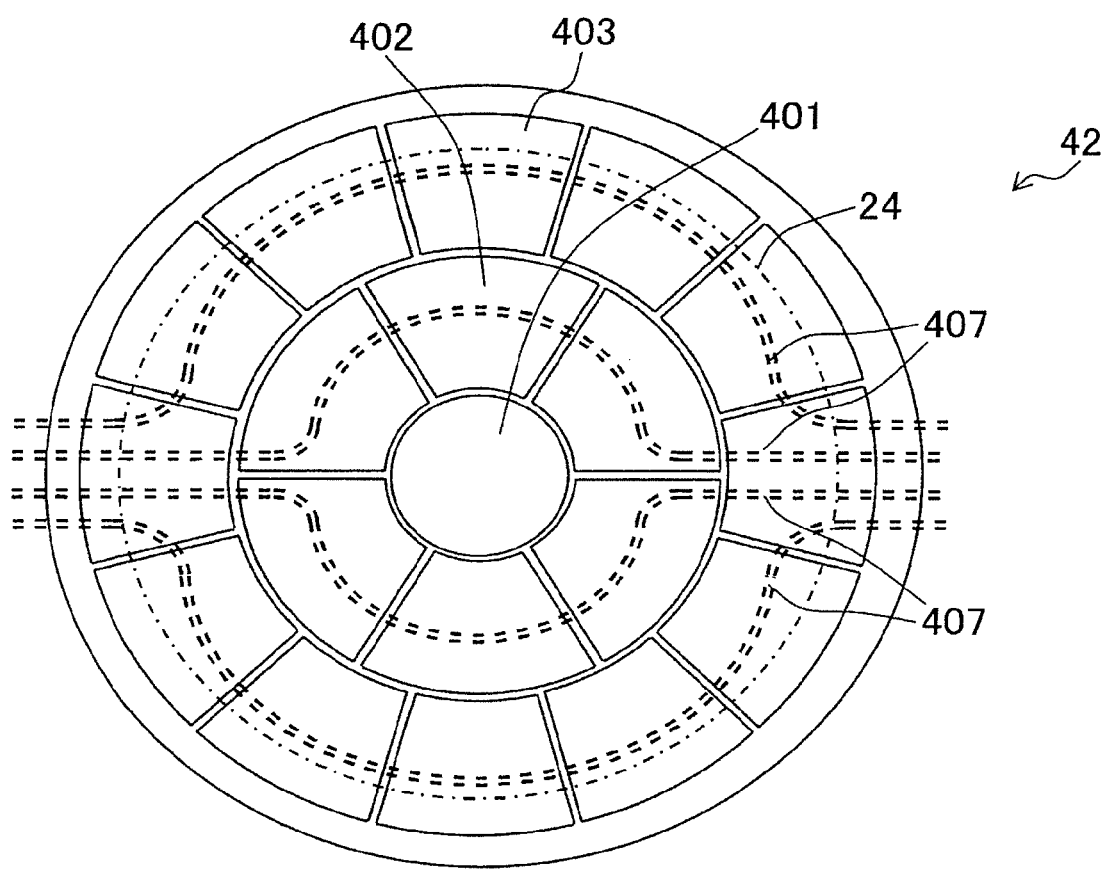
FIG. 16 is a top view of the lower heat module.

FIG. 16 is a top view of the lower heat module 42, which reveals the shape and position of the heater plates 401, 402, 403. As shown in FIG. 16, by setting, as a center, the central axis passing the center of the lower top plate 32, one round heater plate 401 is provided in the center, six heater plates 402 in a fan-like shape are provided to surround it, and 12 heater plates 403 in a fan-like shape are further provided to surround them. The fan-like shape of the heater plates 402, 403 have an arc of a circle concentric with the heat plate 401 at the center.

The plane are covered by the heater plates 401, 402, 403 is larger than the area corresponding to the mounting surface of the substrate holder 24 mounted on the lower top plate 32. This enables heating of the rear surface of the substrate holder 24 evenly. In addition, the heater plates 401, 402, and 403 are parallel to each other with a distance therebetween. Accordingly, even when the heater plates 401, 402, 403 are heated to be expanded by the electric heater 404 embedded therein, they are prevented from being in contact with each other. The interval between the heater plates 401, 402, 403 are pre-set taking into consideration the targeted heating temperature or the like. For example when the heater plates 401, 402, 403 are made of copper, the diameter of the lower top plate 32 is about 350 mm, and the targeted heating temperature is 450 degrees centigrade, the heater plates 401, 402, 403 are set to be about 5 mm.

The heating surface of each heater plate 401, 402, 403 has the same area as each other. Therefore, the diameter, the central angle or the like of the round shape or the fan-like shape are designed to yield the same area. In the example of the drawing, the diameter direction is divided in three stages. However, the number of stages in the diameter direction or the number of rounds or fans in one stage can be arbitrarily set. It is further preferable to equalize the thicknesses of the heater plates 401, 402, and 403, to yield the same heat capacity.

The cooler tube 407 functioning as a cooler is provided to cool one or more of the heater plates 401, 402, 403. For example, as the drawing shows, the cooler tube 407 extends to be in contact with either of the heater plates 402, 403, and an external pump is controlled to circulate the cooling medium therein. The material of the cooling tube is desirably the same as the material of the heater plates 401, 402, 403. If not exactly the same, if at least having the same expansion coefficient as the heater plates, the material is usable as a cooler tube because there will be no thermal slide due to temperature change at the contact surface.

FIG. 17 is a top view of a lower heat module 42 which reveals the positional relation among the first supporting column 418 and the second supporting column 431. The frame 410 has such a shape that a plurality of arms elongate radially from the annular portion at the center. The heater plate 401 is fixed to the annular portion using a screw 408, and the heater plates 402 and 403 are fixed to the arms using screws 408. It is desirable that the screws 408 be arranged on the central line of the heater plates 401, 402, 403, and either to be rotational symmetrical or bilaterally symmetrical.

The pressure from the hollow pressing section 501 is conveyed to the heater plates 401, 402, 403 via the plurality of first supporting columns 418 and the frame 410. Then, the heater plates 401, 402, 403 pressure the lower top plate 32 and heat it. If the hollow pressuring section 501 is considered as an actuator generating a pressing force in the axial direction of the first supporting column 418, the pressing force is conveyed in such an order starting from the first supporting column 418, the heater plate 402, and to the lower top plate 32, focusing on the first supporting column 418 pressuring the heater plate 402.

The plurality of first pressure detecting section 419 can detect the pressure applied to each first supporting column 418, to monitor the output from the hollow pressuring section 501. Adjustment of the pressure of the hollow pressuring section 501 or the lifting and lowering of the elevation module 60 can be pursued depending on the detected pressure. It is further possible to control to stop the pressurizing, when detecting an abnormal pressure exceeding the expected range.

As for the second supporting column 431, it is provided on a circumferential portion of the hollow pressuring section 501 and is installed over the lower plate being the main body of the lower pressure control module 52 via the second pressure detecting section, as shown in FIG. 17. Since the main body of the lower pressure control module 52 is made of a rigid material, unlike the upper plate 511 of the hollow pressuring section 501 which is elastic deformable, the second supporting column 431 can directly convey the pressure from the elevation module 60 to the heater plate 403. In turn, the heater plate 403 conveys the applied pressure to the lower top plate 32.

According to this arrangement, the second pressure detecting section 432, which is provided between the second supporting column 431 and the lower plate of the lower pressure control module 52, can detect the pressure supplied from the elevation module 60 to the lower top plate 32. Adjustment of the pressure of the hollow pressuring section 501 or the lifting and lowering of the elevation module 60 can be pursued depending on the detected pressure. It is further possible to control to stop the pressurizing, when detecting an abnormal pressure exceeding the expected range.

As in FIG. 14 in which the upper plate 511 experiences an upward expansion, the pressure given by the hollow pressuring section 501 to the lower top plate 32 via the first supporting column 418 is larger than the pressure given by the elevation module 60 to the lower top plate 32 via the second supporting column 431. The deformation of the upper plate 511 is the largest at the central portion and gradually decreases towards the periphery, and so the pressure given by the hollow pressuring section 501 to the lower top plate 32 is the largest at the central portion, and gradually decreases towards the periphery.

If the upper plate 511 experiences an inward depression in the direction of the hollow chamber 512 as shown in FIG. 15, the pressure given by the hollow pressuring section 501 to the lower top plate 32 via the first supporting column 418 is smaller than the pressure given by the elevation module 60 to the lower top plate 32 via the second supporting column 431. The deformation of the upper plate 511 is the largest at the central portion and gradually decreases towards the periphery, and so the pressure given by the hollow pressuring section 501 to the lower top plate 32 is the smallest at the central portion, and gradually increases towards the periphery.

If the upper plate 511 is made flat through adjustment of the pressure of the fluid inside the hollow pressuring section 501, the pressure given by the hollow pressuring section 501 to the lower top plate 32 via the first supporting column 418 will be the same as the pressure given by the elevation module 60 to the lower top plate 32 via the second supporting column 431, thereby equalizing the pressure over the plane of the lower top plate 32. In other words, the pressure distribution on the plane of the lower top plate 32 can be finely adjusted, by adjusting the pressure of the fluid in the hollow pressuring section 501. Therefore, even when there is not enough flatness on the front surface or the rear surface of the substrates 22 to be bonded, substrate bonding can be pursued by the fine adjustment of the pressure using the hollow pressuring section 501 to provide even pressure across the plane of the substrate 22.

Figure 18:
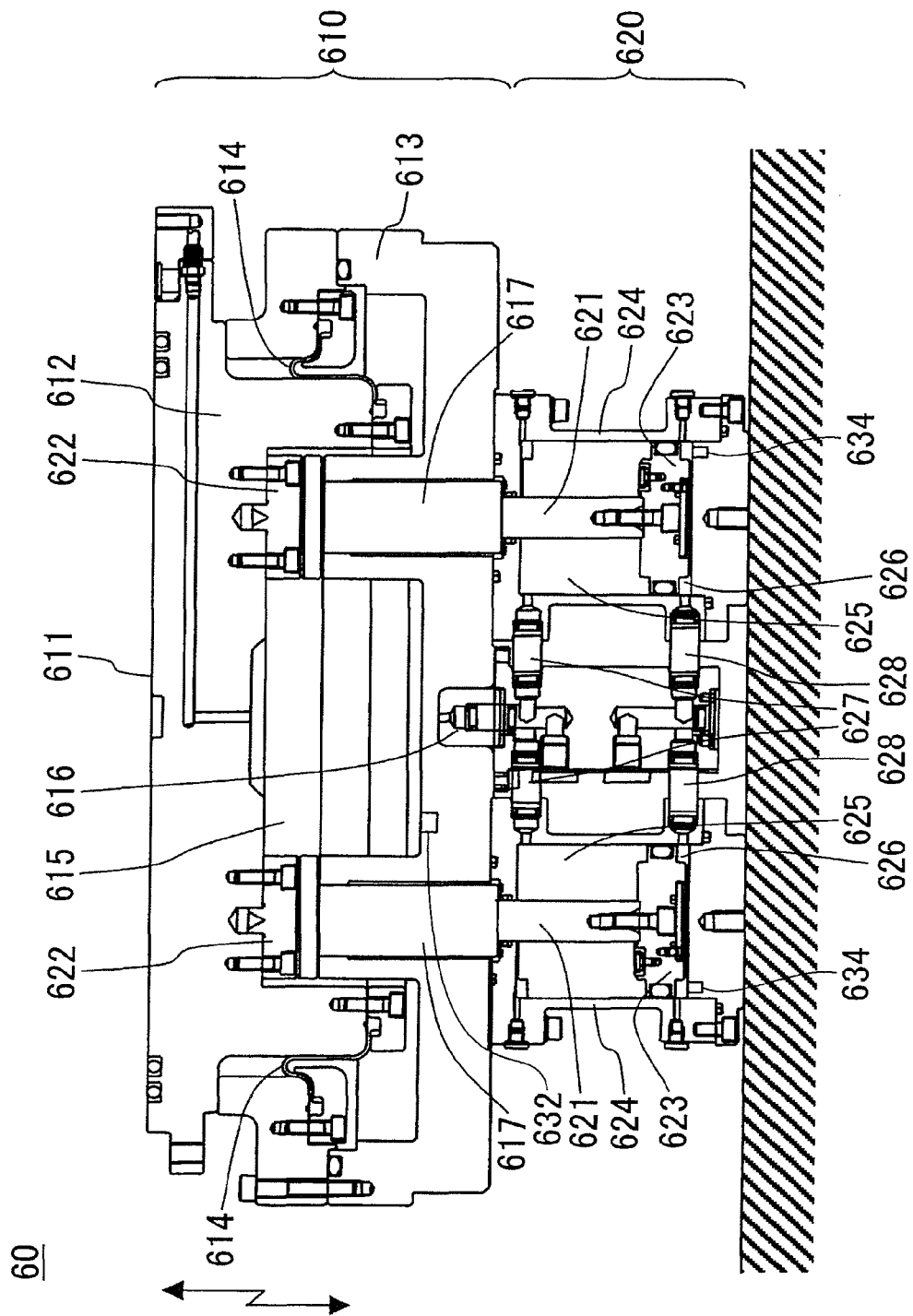
FIG. 18 is a diagrammatic sectional view of the structure of the elevation module.

FIG. 18 is a diagrammatic sectional view of the structure of the elevation module 60. The elevation module 60 is a two-stage structure composed of an upper part and a lower part, which are specifically the main EV section 610 near the lower pressure control module 52 and the sub EV section 620 near the floor. The main EV section 610 is fastened to the lower pressure control module 52 at the base 611. From the perspective of the whole elevation module 60, this base 611 is raised or lowered with respect to the floor, to raise or lower the lower pressure control module 52, and further to pressure the substrate-holder pair.

The main EV section 610 is constituted by a single cylinder piston mechanism having a large diameter, and the sub EV section 620 is constituted by three cylinder piston mechanisms each having a small diameter, positioned at 120 degree intervals when observed from above. Here, it should be noted that the main EV section 610 and the sub EV section 620 interact with each other to raise or lower the base 611, and are not separate bodies simply stacked. The following explains each of these structures.

The main EV section 610 includes a main piston 612 having the base 611 at its upper surface, a main cylinder 613 externally fitted onto the main piston, and a bellows 614 that is connected to the main cylinder 613 and follows the movement of raising and lowering of the main piston 612. A main room 615 which is a space created between the main cylinder 613 and the main piston 612 is maintained air tight even when the main cylinder 613 is raised or lowered. A main valve 616 is connected to the main room 615, to allow a fluid to flow in and out to and from outside. The main room 615 is filled with a fluid. By the main valve 616 controlling the flow-in and flow-out of the fluid, the amount of fluid in the main room 615 can be changed. The main piston 612 can be raised or lowered by changing the amount of fluid within the main room 615.

The main cylinder 613 is provided with a pressure sensor 632. The pressure sensor 632 detects the pressure of the fluid in the main room 615 and monitors it. Adjustment of the pressure of the main room 615 can be pursued depending on the detected pressure, to adjust the lifting and lowering of the elevation module 60. It is further possible to control to stop the pressurizing, when detecting an abnormal pressure exceeding the expected range.

As already mentioned, the sub EV section 620 has three cylinder piston mechanisms in the present embodiment. Each cylinder piston mechanism includes a sub piston 621 and a sub cylinder 624 externally fitted onto the sub piston 621. The sub piston 621 is inserted into the piston guide 617 provided for the main cylinder 613 from outside the main cylinder 613, to reach the inside of the main room 615. In addition, a fixing section 622 to fix to the main piston 612 is provided at the end of the sub piston 621 positioned inside the main room 615. The fixing section 622 fastens the sub piston 621 to the main piston 612.

At the end opposite to the end provided with the fixing section 622, the sub piston 621 includes a piston disc 623 externally fitting onto the sub cylinder 624. The space in the sub cylinder 624 is divided by the piston disc 623 into an upper subroom 625 nearer the main cylinder 613 and a lower subroom 626 nearer the floor.

Both of the upper subroom 625 and the lower subroom 626 are maintained airtight. An upper sub valve 627 is connected to the upper subroom 625 using which a fluid comes in and out to and from outside. To the lower subroom 626, a lower sub valve 628 is connected using which a fluid comes in and out to and from outside. The upper subroom 625 and the lower subroom 626 are filled with a fluid. Moreover, since the total volume of the upper subroom 625 and the lower subroom 626 is always constant, the volume ratio between the upper subroom 625 and the lower subroom 626 can be changed by conducting cooperative control on the upper sub valve 627 and the lower sub valve 628.

The lower subroom 626 is provided with a pressure sensor 634. The pressure sensor 634 detects the pressure of the fluid in the lower subroom 626 and monitors it. Adjustment of the pressure of the lower subroom 626 can be pursued depending on the detected pressure, to adjust the lifting and lowering of the elevation module 60. It is further possible to control to stop the pressurizing, when detecting an abnormal pressure exceeding the expected range.

The upper subroom 625 may also be provided with a pressure sensor, with which the pressure of the liquid in the upper subroom 625 can be detected and monitored.

Figure 19:
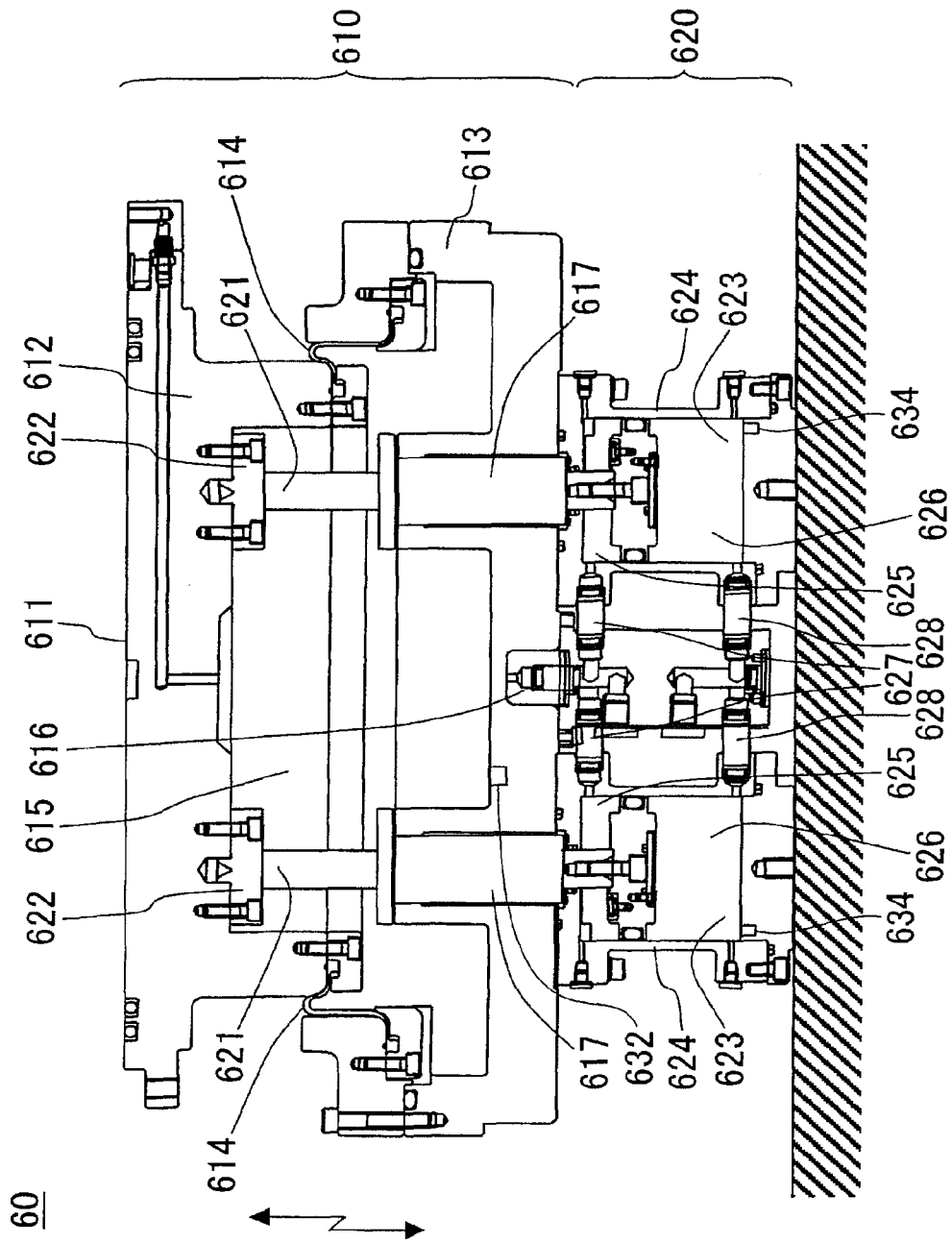
FIG. 19 is a sectional view showing the main piston lifted higher than the lower piston.

FIG. 19 is a sectional view showing the state in which the main piston is raised by lifting the sub piston. By increasing the volume of the lower subroom 626, the volume of the upper subroom 625 decreases, to raise the sub piton 621. Since this sub piston 621 is connected to the main piston 612, the main piston 612 is also elevated. During this process, the main valve 616 is also subjected to cooperative control, to flow, into the main room 615, a fluid in an amount corresponding to the increase in volume of the main room 615 caused in response to the elevation of the main piston 612.

Conversely, if the volume of the upper subroom 625 is increased, the volume of the lower subroom 626 decreases to lower the sub piston 621. This also lowers the main piston 612. During this process, the main valve 616 is also subjected to cooperative control, to release to outside a fluid in an amount corresponding to the decrease in volume of the main room 615 caused in response to the lowering of the main piston 612.

Note that the sub piston 621 also follows the movement of rising of the main piston 612 when the main piston 612 is raised by adjusting the amount of fluid within the main room 615 using the main valve 616. Therefore in this case, it is possible to allow the change in volume of the upper subroom 625 and the lower subroom 626 occurring in response to the movement of the sub piston 621 following the movement of the main piston 612, by cooperative control on the upper sub valve 627 and the lower sub valve 628.

The fluid used to fill the main room 615, the upper subroom 625, and the lower subroom 626 is air, water, oil, etc. For example, hydrofluoroether having excellent environment characteristics may be used.

By structuring the elevation module 60 in two stages of the main EV section 610 and the sub EV section 620, a variety in control is made possible depending on how to move the stage 611. Specifically, when it is desirable to move it faster than a predetermined speed, the fluid in the sub EV section 620 is controlled, from which a larger displacement is obtained with a small volume of input and output fluid. When it is desired to apply a predetermined pressure or more, the fluid in the main EV section 610 is controlled, which experiences a smaller displacement even with a larger amount of input and output fluid. Control can also be directed to the fluid in the main EV section 610 when the stage 611 is to move slower than a predetermined speed.

The pressuring apparatus 840 includes a position sensor for detecting the position of the lower top plate 32. The position sensor may be designed to directly detect the position of the lower top plate 32, or may be designed to detect the position of the main piston 612. When the position sensor is designed detect the position of the main piston 612, the control section may convert the detected value to the position of the lower top plate 32, and use it to control the position of the lower top plate 32. The pressuring apparatus 840 can adjust the moving up and down of the elevation module 60 depending on the detected position. It is further possible to control to stop the moving up or down of the elevation module 60, when detecting an abnormal position outside the expected range.

Figure 20:
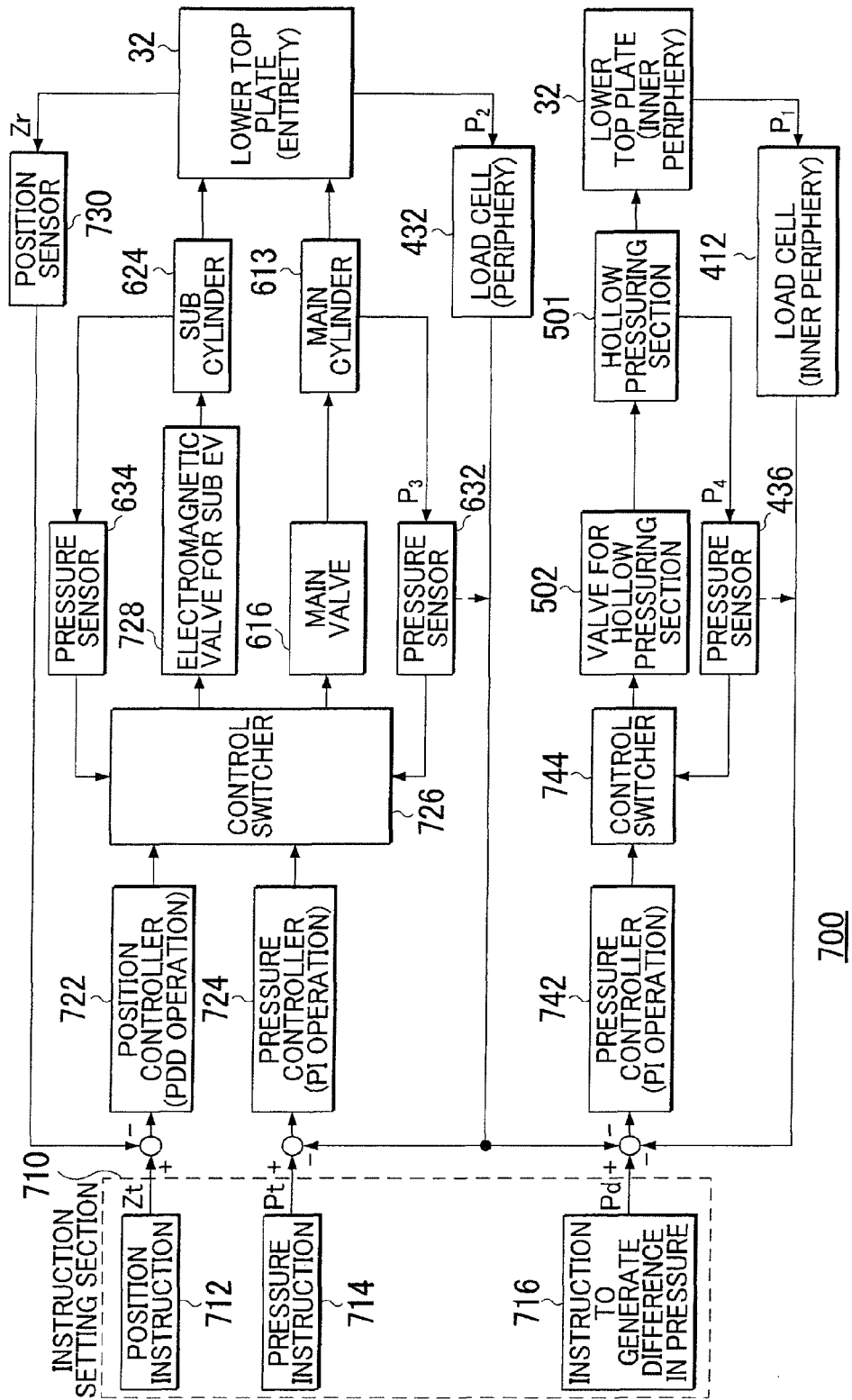
FIG. 20 is a block diagram of a pressuring control system 700.

FIG. 20 is a block diagram of a pressuring control system 700 of the pressuring apparatus 840. The pressuring control system 700 includes an integral control section to control the entire lower top plate, and a section to control the inner section of the lower top plate. The integral control section to control the entire lower top plate includes a common instruction setting section 710, a position controller 722, a pressure controller 724, and a control switcher 726. The section to control the inner section of the lower top plate includes a common instruction setting section 710, a pressure controller 742, and a control switcher 744.

The instruction setting section 710 sets a position instruction, a pressure instruction, and an instruction to generate a difference in pressure, to be given to the position controller 722, the pressure controller 724, and the pressure controller 742. For example, such information as targeted position setting, a raising speed of the lower top plate 32, or the like may be inputted to the instruction setting section 710 to facilitate setting. The targeted pressure setting, the pressuring speed or the like may also be inputted to the instruction setting section 710 to facilitate setting.

The position controller 722 controls the electromagnetic valve for sub EV 728 and the main valve for main EV 616, based on the deviation ($\Delta Z = Z_t - Z_T$) between the targeted position setting ($Z_t$) for the position instruction 712 and the position value ($Z_T$) for the lower top plate 32 detected by the position sensor 730. The electromagnetic valve for sub EV 728 adjusts the amount of the fluid flowing into the sub cylinder 624 according to the control signal, to raise or lower the main piston 612 thereby controlling the position of the lower top plate 32. The main valve 616 adjusts the amount of the fluid flowing into the main cylinder 613 according to the control signal, to raise or lower the main piston 612 thereby controlling the position of the lower top plate 32.

The electromagnetic valve for sub EV 728 includes an upper sub valve 627 and a lower sub valve 628. So as to raise the main piston 612, the sub piston 621 is raised by controlling the lower sub valve 628 thereby adjusting the amount of the fluid flowing into the lower subroom. So as to lower the main piston 612, the sub piston 621 is lowered by controlling the upper sub valve 627 thereby adjusting the amount of the fluid flowing into the upper subroom.

The position controller 722 is a PDD (proportional, differential, differential operation) controller. By enhancing the D (differential) operation control, the main piston 612 can approximate to the targeted position setting more quickly in the fixed command control, and the main piston 612 can follow the targeted position setting more quickly in the follow-up control.

The pressure controller 724 controls the electromagnetic valve for sub EV 728 and the main valve for main EV 616, based on the deviation ($\Delta P = P_t - P_2$) between the targeted pressure setting ($P_t$) for the pressure instruction 714 and the pressure ($P_2$) given to the lower top plate 32 from the elevation module 60 detected by the second pressure detecting section 432, thereby raising or lowering the main piston 612, to control the pressure of the lower top plate 32 (i.e., pressuring power with respect to the substrate-holder pair).

The pressure controller 724 is a PI (proportional, integrating operation) controller. By the PI operation control, it becomes possible to give moderate pressure to the substrate-holder pair.

The control switcher 726 switches control between the position control and the pressure control. In other words, the control switcher 726 selects one of the control signals issued from the position controller 722 and the pressure controller 724, to control the electromagnetic valve for sub EV 728 and the main valve 616. For example, when there is a sufficient distance left before the substrate-holder pair mounted on the lower top plate 32 reaches the upper top plate 31, the processing time can be reduced by adopting the signal from the position controller 722 to control the elevation module 60, to raise the lower top plate 32 quickly, to cause it to approach the upper top plate 31. On the contrary, when the upper top plate 31 and the lower top plate 32 are to sandwich the substrate-holder pair and pressure it, it is better to adopt the control signal from the pressure controller 724 to control the elevation module 60, in an attempt to realize accurate pressuring to the targeted pressure value.

In addition, the control switcher 726 monitors the pressure value detected by the pressure sensor 634 installed in the sub cylinder 624 and the pressure value detected by the pressure sensor 632 installed in the main cylinder 613. When the pressure sensor 634 or the pressure sensor 632 has detected an abnormal pressure, the control switcher 726 can close the electromagnetic valve for sub EV as well as the main valve 616 to stop the moving up or down of the elevation module 60, to prevent breakage of the pressuring apparatus 840 in an emergency.

The position sensor 730 detects the position of the lower top plate 32 and feeds it back, as needed. The deviation ($\Delta Z = Z_t - Z_T$) between the targeted position setting ($Z_t$) for the position instruction 712 and the detected value ($Z_T$) fed back by the position sensor 730 will be the input value to the position controller 722. The second pressure detecting section 432 detects the pressure given from the elevation module 60 to the lower top plate 32 and feeds it back, as needed. The deviation ($\Delta P = P_t - P_2$) between the targeted pressure setting ($P_t$) for the pressure instruction 714 and the detected value ($P_2$) fed back by the second pressure detecting section 432 will be the input value to the pressure controller 724.

The pressure controller 742 controls the valve 502 of the hollow pressuring section 501, based on the deviation ($\Delta P_d = P_d - P_1 + P_2$) being the result of subtracting, from the targeted difference in pressure setting ($P_d$) for the instruction to generate difference in pressure 716, the difference ($P_1 - P_2$) between the pressure ($P_1$) detected by the first pressure detecting section 419 and the pressure ($P_2$) detected by the second pressure detecting section 432, in an attempt to adjust the amount of the fluid flowing into the hollow pressuring section 501. The pressure ($P_2$) detected by the second pressure detecting section 432 is applied to the periphery of the lower top plate 32 from the elevation module 60, and the pressure ($P_1$) detected by the first pressure detecting section 419 is applied to the central portion of the lower top plate 32 from the hollow pressuring section 501. Therefore, the control of the difference in pressure is to control the pressure distribution in the plane of the lower top plate 32, i.e., to control the evenness in the plane of the pressure applied to the substrate-holder pair.

Whether to flow in or out the fluid of the hollow pressuring section 501 can be controlled to yield the obtained difference in pressure ($P_1-P_2$) of no greater than a predetermined value (e.g., 0.05 MPa). It is also possible to control whether to flow in or out the fluid of the hollow pressuring section 501 to yield the difference in pressure ($P_1-P_2$) of zero. The predetermined range of difference in pressure can be designated by an instruction to generate difference in pressure, depending on each purpose of control.

The control switcher 744 monitors the pressure value detected by the pressure sensor 436 installed in the hollow pressuring section 501. When the pressure sensor 436 has detected an abnormal pressure, the control switcher 744 can close the valve 502 to stop controlling the fluid of the hollow pressuring section 501, to prevent breakage of the pressuring apparatus 840 in an emergency.

The first pressure detecting section 419 detects the pressure given to the lower top plate 32 by the hollow pressuring section 501 via the first supporting column 418 and feeds it back, as needed. The deviation ($\Delta P_d = P_d - P_1 + P_2$) being the result of subtracting, from the targeted difference in pressure setting ($P_d$) for the instruction to generate difference in pressure 716, the difference ($P_1-P_2$) between the pressure ($P_1$) detected by the first pressure detecting section 419 and the pressure ($P_2$) detected by the second pressure detecting section 432 will be the input value to the pressure controller 742.

The following explains the process in which the lower top plate 32 of the pressuring apparatus 840 is controlled by means of the pressure control system as shown in FIG. 20. First, as shown in FIG. 12, the elevation module 60 is lowered, to mount the substrate-holder pair on the lower top plate 32. In this state, the substrate-holder pair is greatly distanced from the upper top plate 31, and so the controller switcher 726 selects to control the elevation module 60 using the position controller 722.

The position controller 722 adjusts the lower sub valve 628 by the PDD operation based on the deviation ($\Delta Z = Z_t - Z_T$), to control the fluid of the sub EV section 620 that is greatly displaced by flowing in a small volume of fluid, to quickly raise the elevation module 60. When detecting that the lower top plate 32 is approaching a predetermined position based on the position data ($Z_T$) fed back from the position sensor 730, the position controller 722 adjusts the main valve 616 by the PDD operation, and switches to control the fluid of the main EV section 610 which is hardly displaced even by flowing in a large volume of fluid, in an attempt to raise the elevation module 60.

When the distance between the substrate-holder pair to the upper top plate 31 has reached 10 mm (corresponding to a predetermined position ($Z_t$)), the control switcher 726 switches to pressure control from position control. In other words, it selects to control the elevation module 60 using the pressure controller 724. Following this, the pressure controller 724 adjusts the main valve 616 by the PI operation based on the deviation ($\Delta P = P_t - P_2$), to control the fluid of the main EV section 610 to raise the elevation module 60.

Simultaneously, the pressure controller 742 adjusts the valve 502 of the hollow pressuring section 501 by the PI operation, based on the deviation ($\Delta P_d = P_d - P_1 + P_2$) being the result of subtracting, from the targeted difference in pressure setting ($P_d$) for the instruction to generate difference in pressure 716, the difference ($P_1-P_2$) between the pressure ($P_1$) detected by the first pressure detecting section 419 and the pressure ($P_2$) detected by the second pressure detecting section 432, in an attempt to control the amount of the fluid flowing into the hollow pressuring section 501 thereby controlling the pressure of the hollow pressuring section 501.

For example, by setting the targeted difference in pressure setting ($P_d$) to 0 to control the fluid to flow in or out of the hollow pressuring section 501 to yield the difference in pressure ($P_1-P_2$) of 0, the pressure (($P_1$) detected by the first pressure detecting section 419 will follow the pressure ($P_2$) detected by the second pressure detecting section 432, and so the pressure can be constant across the plane of the lower top plate 32, as well as preventing the breakage of the hollow pressuring section 501 during the pressuring process. When the targeted difference in pressure setting ($P_d$) is set to a certain value, the pressure ($P_1$) detected by the first pressure detecting section 419 can be controlled to maintain the difference in pressure ($P_d$) between it and the pressure ($P_2$) detected by the second pressure detecting section 432. Therefore, it becomes possible to pursue pressuring while maintaining a constant pressure distribution between the central portion and the periphery of the lower top plate 32, depending on purposes.

For example, when the upper plate 511 of the hollow pressuring section 501 is desired to be expanded to increase the pressure of the central portion of the lower top plate 32 compared to that of the periphery, the targeted difference in pressure setting ($P_d$) can be set to a certain positive value, so as to enable control the pressure ($P_1$) detected by the first pressure detecting section 419 to be larger than the pressure ($P_2$) detected by the second pressure detecting section 432. On the contrary, when the upper plate 511 of the hollow pressuring section 501 is desired to be depressed to increase the pressure of the periphery of the lower top plate 32 compared to that of its central portion, the targeted difference in pressure setting ($P_d$) can be set to a certain negative value, so as to enable control the pressure ($P_1$) detected by the first pressure detecting section 419 to be smaller than the pressure ($P_2$) detected by the second pressure detecting section 432.

Also, as shown as the broken line in FIG. 20, instead of feeding back the measured value ($P_2$) of the second pressure detecting section 432, the pressure controller 724 may feed back the pressure ($P_3$) of the main cylinder 613 detected by the pressure sensor 632, thereby adjusting the main valve 616 by the PI operation based on the deviation ($P_t-P_3$) to control the fluid of the main EV section 610, in an attempt to raise the elevation module 60. Likewise, the pressure controller 742 can feed back the pressure ($P_4$) of the hollow pressuring section 501 detected by the pressure sensor 436, thereby adjusting the valve 502 of the hollow pressuring section 501 based on the deviation ($P_d-P_4+P_2$) or deviation ($P_d-P_4+P_3$) to adjust the amount of the fluid flowing in the hollow pressuring section 501 or the pressure of the hollow pressuring section 501, instead of feeding back the pressure ($P_1$) detected by the first pressure detecting section 419.

The pressuring apparatus 840 as shown in FIG. 12 through FIG. 20 adjusts the pressure of the hollow pressuring section 501, based on the difference between the pressure detected by the first pressure detecting section 419 and the pressure detected by the second pressure detecting section 432. However, the embodiment of adjusting a pressure is not limited to such a configuration. In another possible example, the pressure of the hollow pressuring section 501 may be adjusted based on the pressure detected from at least two of the plurality of first pressure detecting sections 419. For example, the aforementioned pressure adjustment may be pursued by setting, to be $P_1$, the pressure detected by the first pressure detecting section 419 nearest to the center between the two first pressure detecting sections 419 whose distance from the center of the lower top plate 32 is different from each other, and setting, to be $P_2$, the pressure detected by the other of the first pressuring detecting sections 419 that is farther from the center. In this case, the averaged values of the pressures detected by the plurality of first pressure detecting sections 419 being at a constant distance from the center can be set to $P_1$ and $P_2$ respectively.

The pressuring apparatuses 240, 840 as shown in FIG. 1 through FIG. 20 convey the pressure of the hollow pressuring section 501 to the lower top plate 32 via the first supporting column 418. However, the embodiment of conveying the pressure is not limited to this example. In an another possible example, the pressure of the hollow pressuring section 501 can be conveyed to the lower top plate 32, by bringing the upper surface of the hollow pressuring section 501 into contact with the lower top plate 32, or by interposing a plate-shaped member therebetween. In such cases, the second supporting column 431 may be omitted.

Although some aspects of the present invention have been described by way of exemplary embodiments, it should be understood that those skilled in the art might make many changes and substitutions without departing from the spirit and the scope of the present invention which is defined only by the appended claims.

The operations, the processes, the steps, or the like in the apparatus, the system, the program, and the method described in the claims, the specification, and the drawings are not necessarily performed in the described order. The operations, the processes, the steps, or the like can be performed in an arbitrary order, unless the output of the former-described processing is used in the later processing. Even when expressions such as "First," or "Next," or the like are used to explain the operational flow in the claims, the specification, or the drawings, they are intended to facilitate the understanding of the invention, and are never intended to show that the described order is mandatory.

What is claimed is:

1. A device comprising:
    a first surface configured to support a plurality of semiconductor substrates;
    a second surface that opposes the first surface such that the plurality of semiconductor substrates is between the first surface and the second surface;
    a driving unit operable to move the first surface toward the second surface until the first surface reaches a predetermined position; and
    a pressing unit operable to deliver a pressing force to the first surface towards the second surface;
    an instruction setting section including at least one instruction to implement cooperative control of the pressing unit by
        moving the first surface toward the second surface with the driving unit,
        detecting a change in position of the first surface with a position sensor while the driving unit moves the first surface toward the second surface, and
        adjusting a volume of a main room of the pressing unit in response to the detected change in position of the first surface until the position sensor detects that the first surface has reached the predetermined position.

2. The device according to claim 1, wherein the driving unit includes at least one sub cylinder piston mechanism.

3. The device according to claim 2, wherein the pressing unit includes a main cylinder piston mechanism having a larger diameter than the at least one sub cylinder piston mechanism.

4. The device according to claim 3, wherein the at least one sub cylinder piston mechanism includes a sub piston and a sub cylinder, the main cylinder piston mechanism includes a main piston and a main cylinder, and the sub piston is fixed to the main piston.

5. The device according to claim 4, wherein the instruction setting section controls an amount of fluid in the sub cylinder via at least one sub valve, an amount of fluid in the main cylinder via a main valve.

6. The device according to claim 5, wherein the instruction setting section controls the at least one sub valve and subjects the main valve cooperative control to move the first surface faster than a predetermined speed.

7. The device according to claim 5, wherein the instruction setting section controls the main valve and subjects the at least one sub valve to cooperative control to move the first surface slower than a predetermined speed.

8. The device according to claim 5, wherein the instruction setting section controls the main valve and subjects the at least one sub valve to cooperative control to apply more than a predetermined amount of pressure to the first surface.

9. The device according to claim 4, wherein the sub piston extends through the main cylinder.

10. The device according to claim 1, wherein the instruction setting section further includes at least one instruction to implement cooperative control of the driving unit by
    moving the first surface toward the second surface with the pressing unit,
    detecting a change in pressure applied to the first surface with a pressure sensor while the pressing unit moves the first surface toward the second surface, and
    adjusting a volume of a sub room of the driving unit in response to a change in elevation of the first surface until the pressure sensor detects that the pressure applied to the first surface has reached a predetermined pressure.

11. A device comprising:
    a first surface configured to support a plurality of semiconductor substrates;
    a second surface that opposes the first surface such that the plurality of semiconductor substrates is between the first surface and the second surface;
    a main piston that is directly fixed to the first surface and operates according to an amount of fluid in a main cylinder to move the first surface towards the second surface; and
    a sub piston that is inserted through the main cylinder and fixed to the main piston and the first surface, the sub piston operating according to an amount of fluid in a sub cylinder to move the first surface towards the second surface;
    wherein the amount of fluid in the sub cylinder is in cooperation with the amount of fluid in the main cylinder, and
    wherein the main piston, the sub piston, and the first surface are all fixed together as a single body, such that the single body and the plurality of semiconductor substrates move toward the second surface in unison.

12. The device according to claim 11, wherein the main cylinder has a larger diameter than the sub cylinder.

13. The device according to claim 11, wherein the sub piston and the main cylinder are positioned to cross a common horizontal plane.

14. The device according to claim 11, further comprising a main valve operable to control the amount of fluid in the main cylinder; and a sub valve operable to control the amount of fluid in the sub cylinder.

15. The device according to claim 14, further comprising an instruction setting section that controls the sub valve and subjects the main valve to cooperative control to move the first surface faster than a predetermined speed.

16. The device according to claim 14, further comprising an instruction setting section that controls the main valve and subjects the sub valve to cooperative control to move the first surface slower than a predetermined speed.

17. The device according to claim 14, further comprising an instruction setting section that controls the main valve and subjects the sub valve to cooperative control to apply more than a predetermined amount of pressure to the first surface.

18. The device according to claim 15, wherein, while subjected to cooperative control, the instruction setting section causes the main valve to transfer, into the main cylinder, an amount of fluid corresponding to an increase in volume of the main cylinder due to elevation of the first surface.

19. The device according to claim 15, wherein, while the main valve is subjected to cooperative control, the instruction setting section causes the main piston to exert no force on the first surface.

\* \* \* \* \*